United States Patent
Li et al.

(10) Patent No.: US 7,241,512 B2
(45) Date of Patent: *Jul. 10, 2007

(54) ELECTROLUMINESCENT MATERIALS AND METHODS OF MANUFACTURE AND USE

(75) Inventors: Yingbo Li, Woodbury, MN (US); John P. Baetzold, North St. Paul, MN (US); Terence D. Spawn, West Lakeland Township, MN (US); Ralph R. Roberts, Cottage Grove, MN (US); James G. Bentsen, North St. Paul, MN (US); John S. Staral, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 486 days.

This patent is subject to a terminal disclaimer.

(21) Appl. No.: 10/285,114

(22) Filed: Oct. 31, 2002

(65) Prior Publication Data
US 2003/0224205 A1 Dec. 4, 2003

Related U.S. Application Data

(60) Provisional application No. 60/374,044, filed on Apr. 19, 2002.

(51) Int. Cl.
*H01J 1/62* (2006.01)
*C09K 11/06* (2006.01)

(52) U.S. Cl. ............... 428/690; 428/917; 313/504; 257/40; 257/103; 252/301.35

(58) Field of Classification Search ............... 428/690, 428/917, 411.1; 313/506, 504; 257/40, 257/E51.029, 103; 528/4; 430/200; 252/301.16, 252/500, 301.35; 525/40
See application file for complete search history.

(56) References Cited

U.S. PATENT DOCUMENTS

| | | | |
|---|---|---|---|
| 4,252,671 A | 2/1981 | Smith | |
| 5,166,024 A | 11/1992 | Bugner et al. | |
| 5,256,506 A | 10/1993 | Ellis et al. | |
| 5,351,617 A | 10/1994 | Williams et al. | |

(Continued)

FOREIGN PATENT DOCUMENTS

DE 19832644 C1 4/2000

(Continued)

OTHER PUBLICATIONS

Baldo et al., "Highly efficient phosphorescent emission from organic electroluminescent devices," *Nature*, vol. 395, pp. 151-154 (Sep. 10, 1998).

(Continued)

*Primary Examiner*—Rena Dye
*Assistant Examiner*—Camie S. Thompson
(74) *Attorney, Agent, or Firm*—Lance L. Vietzke

(57) ABSTRACT

Light emitting polymers can include a plurality of arylene monomeric units and a plurality of soft segment units independently selected from soft segment end caps; soft segment side chains coupled to a portion, but not all, of the arylene monomeric units; internal soft segment monomeric units; and combinations thereof. These light emitting polymers can be used in forming electroluminescent devices or other articles.

13 Claims, 2 Drawing Sheets

U.S. PATENT DOCUMENTS

| | | | |
|---|---|---|---|
| 5,408,109 A | 4/1995 | Heeger et al. | |
| 5,550,290 A | 8/1996 | Mizuta et al. | |
| 5,589,320 A * | 12/1996 | Ohnishi et al. | 430/321 |
| 5,621,131 A | 4/1997 | Kreuder et al. | |
| 5,693,446 A | 12/1997 | Staral et al. | |
| 5,695,907 A | 12/1997 | Chang | |
| 5,708,130 A | 1/1998 | Woo et al. | |
| 5,710,097 A | 1/1998 | Staral et al. | |
| 5,725,989 A | 3/1998 | Chang et al. | |
| 5,728,801 A | 3/1998 | Wu et al. | |
| 5,792,557 A | 8/1998 | Nakaya et al. | |
| 5,840,217 A | 11/1998 | Lupo et al. | |
| 5,869,350 A | 2/1999 | Heeger et al. | |
| 5,900,327 A | 5/1999 | Pei et al. | |
| 5,929,194 A | 7/1999 | Woo et al. | |
| 5,998,085 A | 12/1999 | Isberg et al. | |
| 6,030,715 A | 2/2000 | Thompson et al. | |
| 6,074,734 A | 6/2000 | Kawamura et al. | |
| 6,114,088 A | 9/2000 | Wolk et al. | |
| 6,132,641 A | 10/2000 | Rietz et al. | |
| 6,150,043 A | 11/2000 | Thompson et al. | |
| 6,169,163 B1 | 1/2001 | Woo et al. | |
| 6,194,119 B1 | 2/2001 | Wolk et al. | |
| 6,214,520 B1 | 4/2001 | Wolk et al. | |
| 6,221,543 B1 | 4/2001 | Guehler et al. | |
| 6,221,553 B1 | 4/2001 | Wolk et al. | |
| 6,228,543 B1 | 5/2001 | Mizuno et al. | |
| 6,228,555 B1 | 5/2001 | Hoffend, Jr. et al. | |
| 6,235,414 B1 * | 5/2001 | Epstein et al. | 428/690 |
| 6,242,115 B1 | 6/2001 | Thomson et al. | |
| 6,242,152 B1 | 6/2001 | Staral et al. | |
| 6,284,425 B1 | 9/2001 | Staral et al. | |
| 6,358,664 B1 | 3/2002 | Nirmal et al. | |
| 6,403,236 B1 * | 6/2002 | Ohnishi et al. | 428/690 |
| 6,403,238 B1 * | 6/2002 | Horhold et al. | 428/690 |
| 6,815,505 B2 * | 11/2004 | Wu et al. | 525/204 |
| 2002/0122899 A1 * | 9/2002 | Doi et al. | 428/1.1 |
| 2003/0219625 A1 * | 11/2003 | Wolk et al. | 428/690 |
| 2004/0062930 A1 * | 4/2004 | Roberts et al. | 428/411.1 |
| 2004/0214036 A1 * | 10/2004 | Bensten et al. | 428/690 |

FOREIGN PATENT DOCUMENTS

| | | |
|---|---|---|
| EP | 0637621 | 2/1995 |
| EP | 0 827 367 A2 | 3/1998 |
| EP | 0 851 714 A2 | 7/1998 |
| EP | 0 650 955 B1 | 8/1998 |
| EP | 0 891 121 A1 | 1/1999 |
| EP | 0901174 | 3/1999 |
| EP | 0 953 624 A1 | 11/1999 |
| EP | 1 003 351 A1 | 5/2000 |
| EP | 1 146 574 A2 | 10/2001 |
| EP | 1 162 674 A2 | 12/2001 |
| EP | 0 879 868 B1 | 4/2002 |
| JP | 2000-195673 | 7/2000 |
| WO | WO 98/55561 | 12/1998 |
| WO | WO 99/20711 | 4/1999 |
| WO | WO 99/21935 | 5/1999 |
| WO | WO 99/40655 | 8/1999 |
| WO | WO 00/03565 | 1/2000 |
| WO | WO 00/18851 | 4/2000 |
| WO | WO 00/41894 | 7/2000 |
| WO | WO 00/70655 | 11/2000 |
| WO | WO 01/83410 | 11/2001 |
| WO | WO 02/22374 | 3/2002 |

OTHER PUBLICATIONS

Baldo et al., "Phosphorescent materials for application to organic light emitting devices," *Pure Appl. Chem.* vol. 71, No. 11, pp. 2095-2106 (1999).

Bates, "Polymer—Polymer Phase Behavior," *Science*, vol. 251, pp. 898-905 (Feb. 22, 1991).

Bazan et al., "Fluorescence Quantum Yield of Poly(p-phenylenevinylene) Prepared via the Paracyclophene Route: Effect of Chain Length and Interchain Contacts," *J. Amer. Chem. Soc.*, vol. 118, pp. 2618-2624 (1996).

Brownstein et al., "Structure of 9,10-Di(9,9-dioctylfluorenyl)anthracene in the Solid and in Solution," *J. Org. Chem.*, vol. 67, pp. 663-667 (2002).

Chen et al., "Recent Developments in Molecular Organic Electroluminescent Materials," *Macromol. Symp.* 125, pp. 1-48 (1997).

Cho et al., "Control of band gaps of conjugated polymers by copolymerization," *Synthetic Metals*, vol. 91, pp. 293-296 (1997).

Contoret et al., The Photopolymerization and Cross-Linking of Electroluminescent Liquid Crystals Containing Methacrylate and Diene Photopolymerizable End Groups for Multilayer Organic Light-Emitting Diodes, *Chem. Mater.*, vol. 14, pp. 1477-1487 (2002).

Dellsperger et al., Synthesis and optical properties of novel poly(p-phenylene ethynylene)s, *Macromol. Chem. Phys.*, vol. 201, No. 2, pp. 192-198 (2000).

Dridi et al., "Synthesis and characterization of a conducting copolymer," *Synthetic Metals*, vol. 90, pp. 233-237 (1997).

Ettedgui et al., "Degradation of polymer-based light-emitting diodes during operation," *Synthetic Metals*, vol. 90, pp. 73-76 (1997).

Francke et al., "Synthesis and characterization of a poly(para-phenyleneethynylene)-block-poly(ethylene oxide) rod-coil block copolymer," *Macromol. Rapid Commun.*, vol. 19, pp. 275-281 (1998).

Francois et al., "Block-copolymers with conjugated segments: Synthesis and structural characterization," *Synthetic Metals*, vol. 69, pp. 463-466 (1995).

Friend et al., "Electroluminescence in conjugated polymers", *Nature*, vol. 397, pp. 121-128 (Jan. 14, 1999).

Fujikawa et al., "Energy structures of triphenylamine oligomers," *Synthetic Metals*, vol. 91, pp. 161-162 (1997).

Gebhardt et al., "Light-emitting diodes based on phenylenevinylene oligomers with defined chain lengths," *Synthetic Metals*, vol. 90, pp. 123-126 (1997).

Grazulevicius et al., "Charge-Transporting Polymers and Molecular Glasses", *Handbook of Advanced Electronic and Photonic Materials and Devices*, H.S. Nalwa (ed.), vol. 10, pp. 233-274 (2001).

Herrema et al., "Tuning of the Luminescence in Multiblock Alternating Copolymers. 1. Synthesis and Spectroscopy of Poly(silanylene)thiophenels," *Macromolecules*, vol. 28, pp. 8102-8116 (1995).

Ishiyama et al., "Synthesis of Arylboronates via the Palladium(0)-Catalyzed Cross-Coupling Reaction of Tetra(alkoxo)diborons with Aryl Triflates," *Tetrahedron Letters*, vol. 38, No. 19, pp.3447-3450 (1997).

Jenekhe et al. "Enhancement of Luminescence in Polymer Nanocomposites," *Chem. Mater.*, vol. 6, pp. 1906-1909 (1994).

Jenekhe et al., "Self-Assembled Aggregates of Rod-Coil Block Copolymers and Their Solubilization and Encapsulation of Fullerenes," *Science*, vol. 279, pp. 1903-1907 (Mar. 20, 1998).

Kakali et al., "Synthesis and Characterization of Soluble Aromatic Polyesters Derived from Substituted Terphenyl and Quinquephenyl Diols," *J. Poly. Sci.*, vol. 34, pp. 1581-1588 (1996).

Kim et al., "Novel fluorene-based polymers containing acetylene units," *Synthetic Metals*, vol. 119, pp. 105-106 (2001).

Koene et al., "Asymmetric Triaryldiamines as Thermally Stable Hole Transporting Layers for Organic Light-Emitting Devices," *Chem. Mater.*, vol. 10, pp. 2235-2250 (1998).

Kraft et al., "Electroluminescent Conjugated Polymers—Seeing Polymers in a New Light," *Angew. Chem. Int. Ed.*, vol. 37, pp. 402-428 (1998).

Kreger et al., "Novel starshaped molecules based on fluorone," *Synthetic Metals*, vol. 119, pp. 163-164 (2001).

Lee et al., "Self-Organization of Rod—Coil Molecules with Layered Crystalline States into Thermotropic Liquid Crystalline Assemblies," *J. of Amer. Chem. Soc.*, vol. 120, pp. 9168-9179 (1998).

Lee et al., "White-light electroluminescence from soluble oxadiazole-containing phenylene vinylene ether-linkage copolymer," *Applied Physics Letters*, vol. 79, No. 3, pp. 308-310 (Jul. 16, 2001).

Li et al., "Synthesis and Characterization of Diblock Copolymers Containing Oligothiophenes with Defined Regiospecificity and Molecular Weights," *Macromolecules*, vol. 29, pp. 7329-7334 (1996).

Marrec et al., "The anodic oxidation and polymerization of carbazoles and dicarbazoles N-substituted by polyether chains," *Synthetic Metals*, 89, pp. 171-179 (1997).

Marsitzky et al., "End-Functionalization of Poly(2,7,-fluorene): A Key Step toward Novel Luminescent Rod—Coil Block Copolymers," *Macromolecules*, vol. 32, pp. 8685-8688 (1999).

Marsitzky et al., "Synthesis of rod-coil block copolymer via end-functionalized poly(p-phenylene)s," *Macromol. Rapid Commun.*, vol. 19, pp. 385-389 (1998).

Neher, "Polyfluorene Homopolymers: Conjugated Liquid-Crystalline Polymers for Bright Blue Emission and Polarized Electroluminescence," *Macromol. Rapid Commun.*, vol. 22, No. 17, pp. 1365-1385 (2001).

Osaheni et al., "Electroactive and Photoactive Rod—Coil Copolymers: Design, Synthesis, and Supramolecular Regulation of Photophysical Properties," *J. Amer. Chem. Soc.*, vol. 117, pp. 7389-7398 (1995).

Pilgram et al., "Bromination of 2,1,3-Benzothiadiazoles," *J. Heterocycl. Chem.*, vol. 7, Nos. 1-3, pp. 629-633 (1970).

Ranger et al., "Novel base-dopable poly(2,7-fluorenylene) derivatives," *Chem. Commun.*, 1597-1598 (1997).

Ranger et al., "Optical and electrical properties of fluorene-based π-conjugated polymers," *Can. J. Chem.*, vol. 76, pp. 1571-1577 (1998).

Robinson et al., "Electroluminescence from Well-Defined Tetrahedral Oligophenylenevinylene Tetramers," *Advanced Materials*, vol. 12, No. 22, pp. 1701-1704 (Nov. 16, 2000).

Roitman et al., "Polymer Thermosetting Organic Light-Emitting Devices," *IEEE J. of Selected Topics in Quantum Electronics*, vol. 4, No. 1, pp. 58-66 (Jan./Feb. 1998).

Sainova et al., "Control of color and efficiency of light-emitting diodes based on polyfluorenes blended with hole-transporting molecules," *Applied Physics Letters*, vol. 76, No. 14, pp. 1810-1812 (Apr. 3, 2000).

Shirota, "Organic materials for electronic and optoelectronic devices," *J. Mater. Chem.*, vol. 10, pp. 1-15 (2000).

Tanaka et al., "Preparation of hyperbranched copolymers constituted of triphenylamine and phenylene units," vol. 119, pp. 139-140 (2001).

Tanaka et al., "Novel hole-transporting materials based on triphenylamine for organic electroluminescent devices," *Chem. Commun.*, No. 18, pp. 2175-2176 (Sep. 21, 1996).

Tang et al., "Electroluminescence of doped organic thin films," *J. Appl. Phys.*, vol. 65, No. 9, pp. 3610-3616 (May 1, 1989).

Tashiro et al., "Polyethers. 1. Preparation of ω,ω'-Bis(triphenylphosphine) Polyethers," *J. Org. Chem.* vol. 45, pp. 1156-1158 (1980).

Tokito et al., "Thermal stability of electroluminescent devices fabricated using novel charge-transporting materials," *Polym. Prep.* vol. 38, No. 1, pp. 388-389, (1997).

Tokito et al., "Thermal stability in oligomeric triphenylamine/tris (8-quinolinolato) aluminium electroluminescent devices," *Applied Physics Letters*, vol. 70, No. 15, pp. 1929-1931 (1997).

Van Krevelen; "Cohesive Properties and Solubility," Elsevier Science Publishers B.V., Chpt. 7, pp. 189-225 (1990).

Wagner et al., "Rigid—Flexible Alternating Block Copolymers That Contain Poly(p-phenylene) Units of Defined Length as the Rigid Blocks," *Macromolecules*, vol. 34, pp. 5740-5743 (2001).

Widawski et al., "Self-organized honeycomb morphology of star-polymer polystyrene films," *Nature*, vol. 369, pp. 387-389 (Jun. 2, 1994).

Weinfurtner et al., "Highly efficient pure blue electroluminescence from polyfluorene: Influence of the molecular weight distribution on the aggregation tendency," *Applied Physics Letters*, vol. 76, No. 18, pp. 2502-2504 (May 1, 2000).

Yang et al., "A Soluble Blue-Light-Emitting Polymer," *Macromolecules*, vol. 26, pp. 1188-1190 (1993).

Abstract for DE 19832644 C1.

* cited by examiner

ELECTROLUMINESCENT MATERIALS AND METHODS OF MANUFACTURE AND USE

This application claims the benefit of U.S. Provisional Application Ser. No. 60/374,044 filed Apr. 19, 2002, which is incorporated herein by reference.

BACKGROUND

Electroluminescent materials can be used to make organic electroluminescent (OEL) devices such as organic light emitting diodes (OLEDs). There is continuing research and development of materials suitable for such devices and methods for making the devices. In some instances, materials can be selected or developed which facilitate one or more of these methods.

Patternwise thermal transfer of materials from donor sheets to receptor substrates has been proposed as one method for forming OEL devices. Selective thermal transfer of organic light emitters for formation of organic electroluminescent devices has been shown to be particularly useful.

SUMMARY OF THE INVENTION

Generally, the present invention relates to electroluminescent materials, organic electroluminescent devices, articles containing the organic electroluminescent devices, and methods of making and using the organic electroluminescent devices and articles.

One embodiment is a composition containing a light emitting polymer. This light emitting polymer includes a plurality of arylene monomeric units and a plurality of soft segment units independently selected from soft segment end caps; soft segment side chains coupled to a portion, but not all, of the arylene monomeric units; internal soft segment monomeric units; and combinations thereof. This composition can be used in electroluminescent devices or other articles.

Another embodiment is a method of making an electroluminescent device or other article that includes selectively transferring the light emitting polymer from a donor sheet to a receptor.

Yet another embodiment is a donor sheet having a substrate, a light-to-heat conversion layer, and a transfer layer containing the light emitting polymer.

Examples of suitable light emitting polymers include those having Formulas I to XVII:

  I

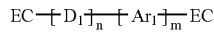  II

  III

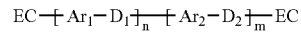  IV

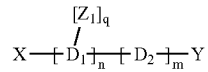  V

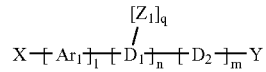  VI

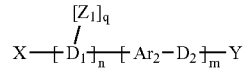  VII

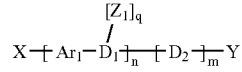  VIII

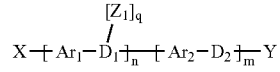  IX

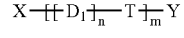  X

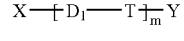  XI

  XII

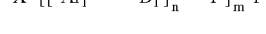  XIII

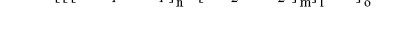  XIV

  XV

  XVI

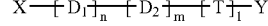  XVII where $D_1$ and $D_2$ are substituted or unsubstituted arylene moieties, each EC is independently a soft segment end cap group, X and Y are capping groups, $Ar_1$ and $Ar_2$ are independently selected from substituted and unsubstituted C6–C20 arylene, substituted and unsubstituted C2–C20 heteroarylene, and substituted and unsubstituted C18–C60 divalent triarylamines, k, l, m, n, and o are integers in the range of 2 to 1000, q is an integer in the range of 1 to 4, each $Z_1$ is independently a soft segment side chain, and each T is independently a soft segment moiety.

Suitable light emitting polymers also include polymers having Formulas I' to XVII':

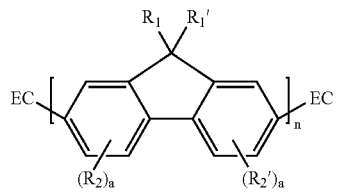  I'

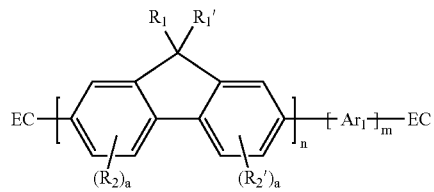  II'

-continued
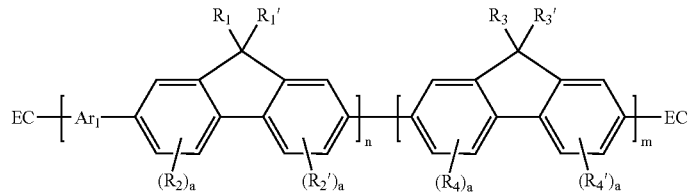
III'
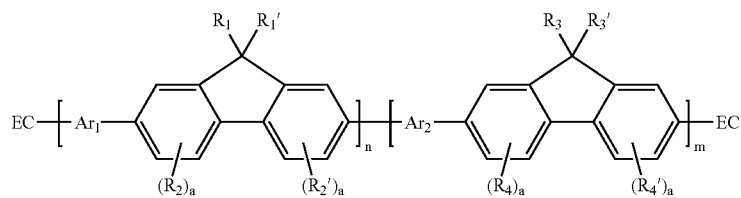
IV'
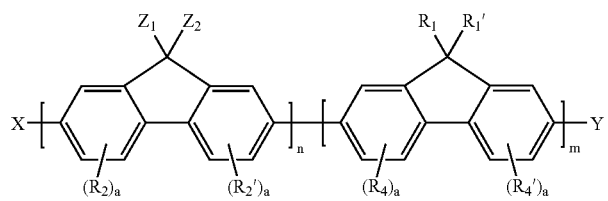
V'
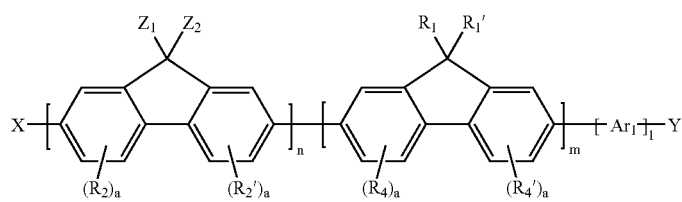
VI'
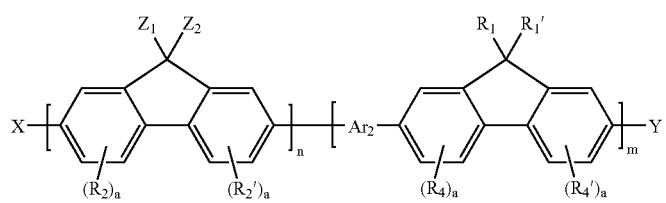
VII'
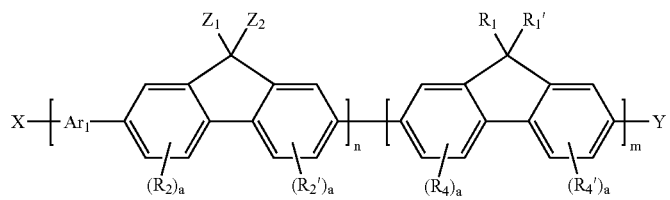
VIII'
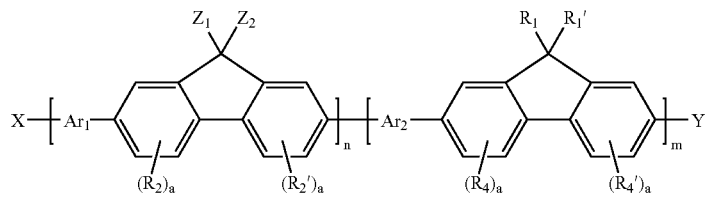
IX'
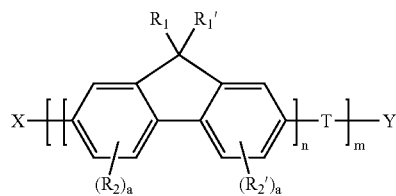
X'
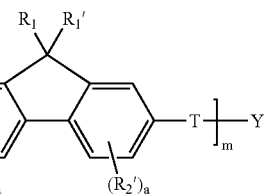
XI'

-continued

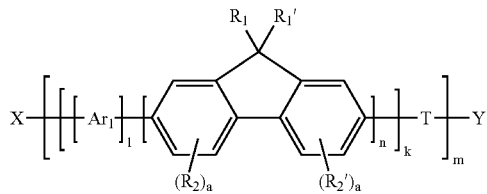

XII'

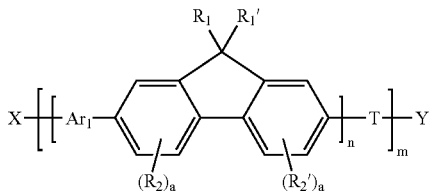

XIII'

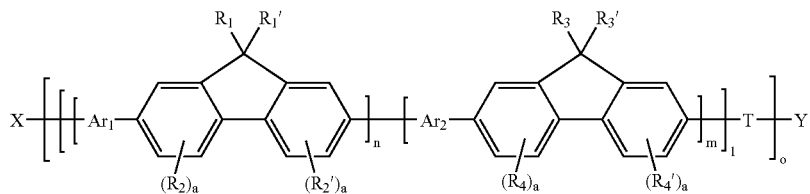

XIV'

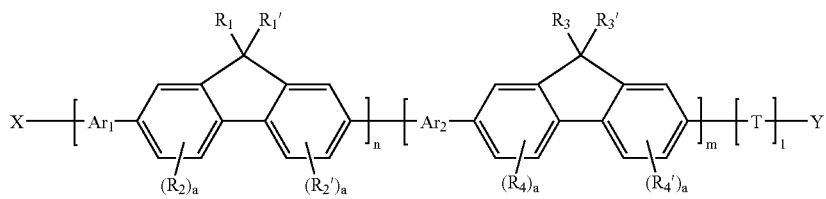

XV'

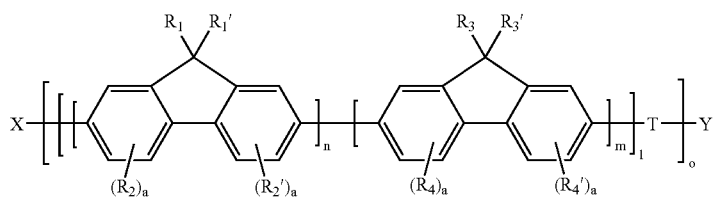

XVI'

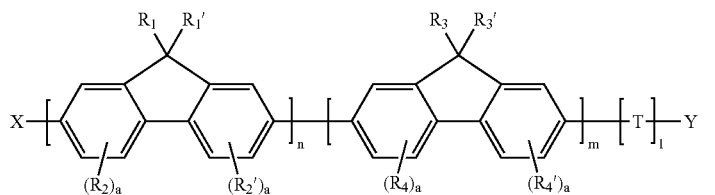

XVII' where $R_1$, $R_1'$, $R_3$, and $R_3'$ are independently hydrogen, substituted or unsubstituted C1–C30 alkyl, substituted or unsubstituted C6–C20 aryl, substituted or unsubstituted C3–C20 heteroaryl, or substituted or unsubstituted C1–C30 hydrocarbyl containing one or more S, N, O, P, or Si atoms; $R_2$, $R_2'$, $R_4$ and $R_4'$ are independently substituted or unsubstituted C1–C20 alkyl, substituted or unsubstituted C6–C20 aryl, substituted or unsubstituted C3–C20 heteroaryl, or substituted or unsubstituted C1–C30 hydrocarbyl containing one or more S, N, O, P, or Si atoms; a is independently in each occurrence 0 or 1; each EC is independently a soft segment end cap group; X and Y are capping groups; $Ar_1$ and $Ar_2$ are independently selected from substituted and unsubstituted C6–C20 arylene, substituted and unsubstituted C2–C20 heteroarylene, and substituted and unsubstituted C18–C60 divalent triarylamines; k, l, m, n, and o are integers in the range of 2 to 1000; each $Z_1$ and $Z_2$ is independently a soft segment side chain; and each T is independently a soft segment moiety.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
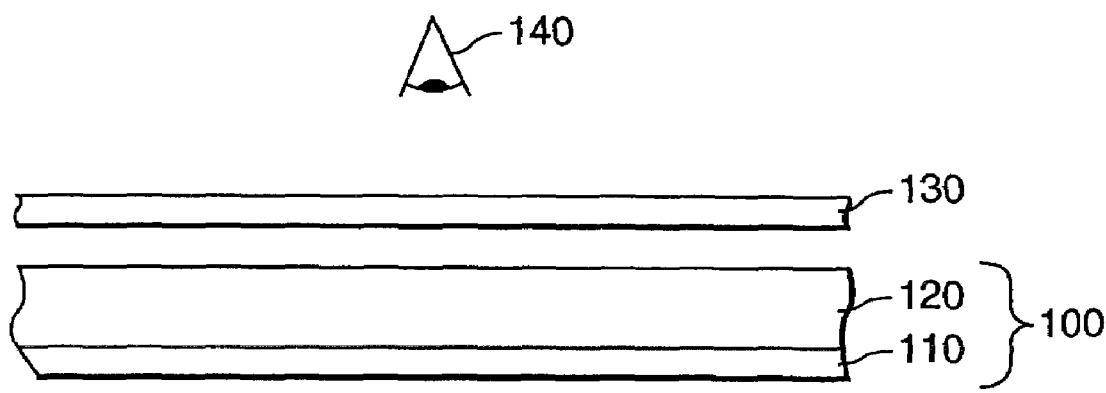
FIG. 1 is a schematic side view of an organic electroluminescent display construction.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention contemplates electroluminescent materials and methods for making devices from these materials including, but not limited to, selective thermal patterning of the electroluminescent materials onto a receptor. Such methods and materials can be used to form devices including organic electronic devices and displays. Examples of organic electronic devices that can be made include organic transistors, photovoltaic devices, organic electroluminescent (OEL) devices such as organic light emitting diodes (OLEDs), and the like. In addition, these materials and methods can also be useful for non-thermal printing, patterning, and transfer methods including, for example, inkjet printing, screen printing, and photolithographic patterning.

Organic electroluminescent (OEL) display or device refers to electroluminescent displays or devices that include an organic emissive material, whether that emissive material includes a small molecule (SM) emitter, a SM doped polymer, a light emitting polymer (LEP), a doped LEP, a blended LEP, or another organic emissive material whether provided alone or in combination with any other organic or inorganic materials that are functional or non-functional in the OEL display or device.

R. H. Friend, et al. ("Electroluminescence in Conjugated Polymers", *Nature*, 397, 121 (1999)), incorporated herein by reference, describe one mechanism of electroluminescence as including the "injection of electrons from one electrode and holes from the other, the capture of oppositely charged carriers (so-called recombination), and the radiative decay of the excited electron-hole state (exciton) produced by this recombination process."

Materials for OEL devices can be small molecule (SM) or polymeric in nature. SM materials include charge transporting, charge blocking, semiconducting, and electroluminescent organic and organometallic compounds. Generally, SM materials can be vacuum deposited or evaporated to form thin layers in a device. In practice, multiple layers of SMs are typically used to produce efficient OELs since a given material generally does not have both the desired charge transport and electroluminescent properties.

LEP materials are typically conjugated polymeric or oligomeric molecules that preferably have sufficient film-forming properties for solution processing. Conventionally, LEP materials are utilized by casting a solvent solution of the LEP material on a substrate, and evaporating the solvent, thereby leaving a polymeric film. Other methods for forming LEP films include ink jetting and extrusion coating. Alternatively, LEPs can be formed in situ on a substrate by reaction of precursor species. Efficient LEP lamps have been constructed with one, two, or more organic layers.

As an example of device structure, FIG. 1 illustrates an OEL display or device 100 that includes a device layer 110 and a substrate 120. Any other suitable display component can also be included with display 100. Optionally, additional optical elements or other devices suitable for use with electronic displays, devices, or lamps can be provided between display 100 and viewer position 140 as indicated by optional element 130.

In some embodiments like the one shown, device layer 110 includes one or more OEL devices that emit light through the substrate toward a viewer position 140. The viewer position 140 is used generically to indicate an intended destination for the emitted light whether it be an actual human observer, a screen, an optical component, an electronic device, or the like. In other embodiments (not shown), device layer 110 is positioned between substrate 120 and the viewer position 140. The device configuration shown in FIG. 1 (termed "bottom emitting") may be used when substrate 120 is transmissive to light emitted by device layer 110 and when a transparent conductive electrode is disposed in the device between the emissive layer of the device and the substrate. The inverted configuration (termed "top emitting") may be used when substrate 120 does or does not transmit the light emitted by the device layer and the electrode disposed between the substrate and the light emitting layer of the device does not transmit the light emitted by the device.

Device layer 110 can include one or more OEL devices arranged in any suitable manner. For example, in lamp applications (e.g., backlights for liquid crystal display (LCD) modules), device layer 110 might constitute a single OEL device that spans an entire intended backlight area. Alternatively, in other lamp applications, device layer 110 might constitute a plurality of closely spaced devices that can be contemporaneously activated. For example, relatively small and closely spaced red, green, and blue light emitters can be patterned between common electrodes so that device layer 110 appears to emit white light when the emitters are activated. Other arrangements for backlight applications are also contemplated.

In direct view or other display applications, it may be desirable for device layer 110 to include a plurality of independently addressable OEL devices that emit the same or different colors. Each device might represent a separate pixel or a separate sub-pixel of a pixilated display (e.g., high resolution display), a separate segment or sub-segment of a segmented display (e.g., low information content display), or a separate icon, portion of an icon, or lamp for an icon (e.g., indicator applications).

In at least some instances, an OEL device includes a thin layer, or layers, of one or more suitable organic materials sandwiched between a cathode and an anode. When activated, electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. The region of the device in which the excitons are generally formed can be referred to as the recombination zone. These excitons, or excited state species, can emit energy in the form of light as they decay back to a ground state.

Other layers can also be present in OEL devices such as hole transport layers, electron transport layers, hole injection layer, electron injection layers, hole blocking layers, electron blocking layers, buffer layers, and the like. In addition, photoluminescent materials can be present in the electroluminescent or other layers in OEL devices, for example, to convert the color of light emitted by the electroluminescent material to another color. These and other such layers and materials can be used to alter or tune the electronic properties and behavior of the layered OEL device, for example to achieve a desired current/voltage response, a desired device efficiency, a desired color, a desired brightness, and the like.

FIGS. 4A to 4D illustrate examples of different OEL device configurations. Each configuration includes a substrate 250, an anode 252, a cathode 254, and a light emitting layer 256. The configurations of FIGS. 4C and 4D also include a hole transport layer 258 and the configurations of FIGS. 4B and 4D include an electron transport layer 260. These layers conduct holes from the anode or electrons from the cathode, respectively.

The anode 252 and cathode 254 are typically formed using conducting materials such as metals, alloys, metallic compounds, metal oxides, conductive ceramics, conductive dispersions, and conductive polymers, including, for example, gold, platinum, palladium, aluminum, calcium, titanium, titanium nitride, indium tin oxide (ITO), fluorine tin oxide (FTO), and polyaniline. The anode 252 and the cathode 254 can be single layers of conducting materials or they can include multiple layers. For example, an anode or a cathode may include a layer of aluminum and a layer of gold, a layer of calcium and a layer of aluminum, a layer of aluminum and a layer of lithium fluoride, or a metal layer and a conductive organic layer. As indicated above, in some embodiments one or both of the electrodes (anode and cathode) is transparent.

The hole transport layer 258 facilitates the injection of holes from the anode into the device and their migration towards the recombination zone. The hole transport layer 258 can further act as a barrier for the passage of electrons to the anode 252. The hole transport layer 258 can include, for example, a diamine derivative, such as N,N'-bis(3-methylphenyl)-N,N'-bis(phenyl)benzidine (also known as TPD) or N,N'-diphenyl-N,N'-bis(1-naphthylphenyl)-1,1'-biphenyl-4,4'-diamine (NPB), or a triarylamine derivative, such as, 4,4',4''-Tris(N,N-diphenylamino)triphenylamine (TDATA) or 4,4',4''-Tris(N-3-methylphenyl-N-phenylamino)triphenylamine (mTDATA). Other examples include copper phthalocyanine (CuPC); 1,3,5-Tris(4-diphenylaminophenyl)benzenes (TDAPBs); and other compounds such as those described in H. Fujikawa, et al., *Synthetic Metals*, 91, 161 (1997) and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233–274 (2001), both of which are incorporated herein by reference.

The electron transport layer 260 facilitates the injection of electrons and their migration towards the recombination zone. The electron transport layer 260 can further act as a barrier for the passage of holes to the cathode 254, if desired. As an example, the electron transport layer 260 can be formed using the organometallic compound tris(8-hydroxyquinolato) aluminum (Alq3). Other examples of electron transport materials include 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole (tBuPBD) and other compounds described in C. H. Chen, et al., *Macromol. Symp.* 125, 1 (1997) and J. V. Grazulevicius, P. Strohriegl, "Charge-Transporting Polymers and Molecular Glasses", *Handbook of Advanced Electronic and Photonic Materials and Devices*, H. S. Nalwa (ed.),10, 233 (2001), both of which are incorporated herein by reference.

The light emitting layer includes a light emitting polymer material and optionally includes other materials, such as, for example, hole transport material, electron transport material, binder (e.g., a polymeric binder), small molecule emitter material, waveguiding particles, phosphorescent compounds, and color conversion material.

The light emitting polymer material includes one or more light emitting polymers. Conventional polymers may be difficult to thermally transfer or otherwise deposit on a desired substrate surface. In some instances, it is desirable to select the material on the substrate surface and the material to be transferred (e.g., the light emitting polymer material) such that the solubility parameters are compatible. As an example, the materials can be selected such that the difference in these solubility parameters is no more than 4 $J^{1/2}$ $cm^{-3/2}$ and, preferably, no more than 2 $J^{1/2}$ $cm^{-3/2}$ as determined according to "Properties of Polymers; Their Correlation with Chemical Structure; their Numerical Estimation and Prediction from Additive Group Contributions." third, completely revised edition by D. W. Van Krevelen; Elsevier Science Publishers B. V., 1990; Chapter 7, pp 189–225, incorporated herein by reference.

The solubility parameter of a polymer can be determined from measurements of the extent of equilibrium swelling of the polymer in a range of solvents of differing solubility parameters. The solubility parameters of the solvents themselves can be determined from their heats of evaporation. The solubility parameter $\delta$ is related to the cohesive energy $E_{coh}$ and the specific volume V by the relationship $\delta = (E_{coh}/V)^{1/2}$. For solvents of low molecular weight, the cohesive energy is closely related to the molar heat of evaporation $\Delta H_{vap}$ according to $E_{coh} = \Delta H_{vap} - p\Delta V = \Delta H_{vap} - RT$. Thus, $E_{coh}$ and $\delta$ can be calculated from the heat of evaporation of the solvent or from the course of the vapor pressure as a function of temperature.

Because polymers cannot be evaporated, indirect methods can be used for determination of the solubility parameter. To determine the solubility parameter of the polymer, one measures the equilibrium swelling of the polymer in a variety of solvents of differing $\delta$ and generates a plot of equilibrium swelling of the polymer vs. the solubility parameter of the solvents. The solubility parameter of the polymer is defined as the point on this plot where maximum swelling is obtained. Swelling will be less for solvents having solubility parameters that are less than or greater than that of the polymer. There are also several methods for theoretically estimating the solubility parameter of a polymer based on the additive contributions of functional groups present in the polymer as outlined in the above-cited reference.

Some polymers may generate undesirable emission through, for example, excimer formation, as described, for example, in D. Neher, *Macromol. Rapid Commun.*, 22, 1365–1385 (2001), incorporated herein by reference. Light emitting polymers can be selected which reduce excimer and exciplex formation, if desired. For example, the light emitting polymers can have sterically hindering groups to reduce the formation of intermolecular or intramolecular configurations that produce excimer or exciplex emission.

Suitable light emitting polymers, according to the invention, include polymers having arylene monomeric units and soft segment end caps, soft segment side chains, internal soft segments, or combinations thereof, as described below. These polymers can be used alone or in combination with each other or with other light emitting polymers or small molecule materials to form the light emitting polymer material. As indicated below, copolymers with more than one arylene monomeric unit can be used and may be particularly desirable for some embodiments. The soft segments in these light emitting polymers can, if desired, provide better solubility parameter matching to a receptor substrate than a similar polymer without the soft segments. In addition or alternatively, the soft segments can alter other properties useful to thermal transfer and film stability such as, for example, molecular weight, melting temperature, glass transition temperature, percent crystallinity, tendency to crystallize or form aggregates, viscosity, thin film morphology, Theological properties such as melt viscosity and relaxation time, excimer and exciplex formation, cohesive strength, and light emission frequency, if desired.

The following examples of suitable light emitting polymers utilize monomer units based on fluorene functional groups. It will be understood that other arylene or heteroarylene monomer units can also be used, as discussed below. Unless otherwise indicated any of the functional groups (for example, alkyl, aryl, heteroaryl, alkylene, arylene, and heteroarylene functional groups) listed in the following discussion can be substituted or unsubstituted. In addition, unless otherwise indicated, for polymers with more than one type of monomer unit the bracketed monomer units of the Formulas illustrated herein can be arranged in any order; for example, the monomer units can be arranged in random order, alternating order, or in blocks, to form random, alternating, or block copolymers. In at least some embodiments, the specific selection of a random copolymer, alternating copolymer, or block copolymer can be desired.

Examples of light emitting polymers with soft segment end caps are illustrated by Formula 1:

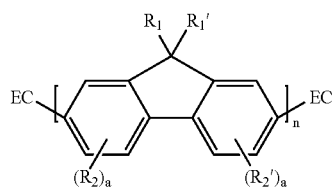

where $R_1$ and $R_1'$ are independently hydrogen, C1–C30 alkyl, C6–C20 aryl, C3–C20 heteroaryl, or C1–C30 hydrocarbyl containing one or more S, N, O, P, or Si atoms; $R_2$ and $R_2'$ are independently C1–C20 alkyl, C6–C20 aryl, C3–C20 heteroaryl, or C1–C30 hydrocarbyl containing one or more S, N, O, P, or Si atoms; a is independently in each occurrence 0 or 1; and n is an integer in the range of 3 to 1000. EC is an end cap group having the general formula

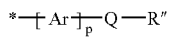

where Ar is arylene or heteroarylene, p is 0 or 1, R" is a sterically hindering functional group such as an aryl, heteroaryl, or a branched alkyl, and Q is a soft segment moiety. Preferably, R" is an aryl, for example, phenyl or biphenyl. The use of a sterically hindering functional group can reduce or prevent the formation of intermolecular or intramolecular excimer configurations.

In some embodiments, $R_1$ and $R_1'$ are independently C1–C30 alkyl, C6–C20 aryl, or C3–C20 heteroaryl. In some embodiments, $R_1$ and $R_1'$ are preferably C3–C15 alkyl. In some embodiments, each a is zero.

The soft segment moieties include two or more functional groups selected from ethers, fluoroalkylenes, perfluoroalkylenes, secondary or tertiary amines, thioethers, esters, dialkylsiloxanes, and dialkoxysiloxanes. These functional groups can be the same or different. Suitable soft segment moieties include, for example, poly(oxyalkylene) functionalities (e.g., $-O(C_qH_{2q}O)_s-$ or $-(C_qH_{2q}O)_s-$ where q is an integer in the range of 1 to 6 and s is an integer in the range of 2 to 20) and poly(dimethylsiloxane) or other poly(dialkylsiloxane) functionalities, or a combination thereof. In the solid phase, the soft segment moieties present in the polymer may reside in the same or separate phase(s) from the remainder of the polymer.

In one embodiment, Ar is phenylene, p is 1, R" is C6–C20 aryl (for example, phenyl or biphenyl), and Q is a C2 to C20 poly(oxyalkylene). Examples for making these polymers using Suzuki coupling are illustrated below in the Examples.

Copolymers can also be formed. Any comonomer or combination of two or more comonomers can be used. The incorporation of comonomers into the polymer may be used to modify the light absorption, light emission, ionization potential, or electron and hole conducting properties of the polymer that would otherwise be primarily made of 9,9-disubstituted fluorene groups. Such copolymers can be prepared using methods outlined in U.S. Pat. No. 6,169,163, incorporated herein by reference. Preferred comonomers include aryl groups that are conjugated within the comonomer, conjugated (when polymerized) with the fluorene monomers, or both.

Formula 2 illustrates a preferred copolymer.

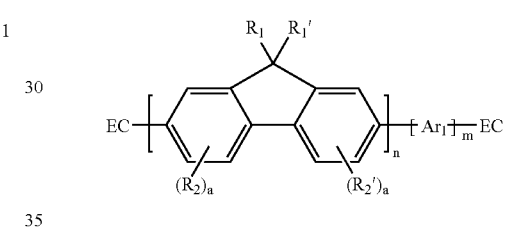

$R_1$, $R_1'$, $R_2$, $R_2'$, EC, and a are as described for Formula 1. $Ar_1$ is selected from C6–C20 arylene, C2–C20 heteroarylene, and C18–C60 divalent triarylamines. m and n are integers in the range of 2 to 1000. Capping can be performed as a separate step, or the monofunctional capping group can be added to the growing polymer reaction mixture as a chain terminating reagent.

A variety of methods can be used to make such copolymers. For example, dihalo-functional comonomers are reacted with dihalo-functional fluorene compounds in nickel coupling polymerization reactions to provide randomly copolymerized polymers that are terminated with reactive halide groups. Reaction with monofunctional capping groups EC give rise to randomly copolymerized and soft segment end capped structures.

In another method using Suzuki coupling, one or more dibromo functional comonomers can be used in conjunction with fluorene-diboronic acid or fluorene-diboronates to prepare alternating copolymers bearing reactive end groups. Likewise, conjugated comonomers bearing diboronic acid or diboronate functionalities can be used in conjunction with 2,7-dibromofluorenes to give rise to alternating copolymers bearing reactive end groups.

Furthermore, by reaction of difunctional comonomers with mixtures of different 2,7-dibromofluorenes or 2,7-diboronyl fluorenes one can prepare copolymers having varying mole fractions of the comonomers, polymerized in an alternating fashion with the fluorene monomers. Subsequent reaction of any of these polymers with monofunctional capping groups EC can give rise to alternating copolymers and terpolymers bearing soft segment end capping groups. For example, polymers such as those illustrated in Formulas 3 and 4 can be formed.

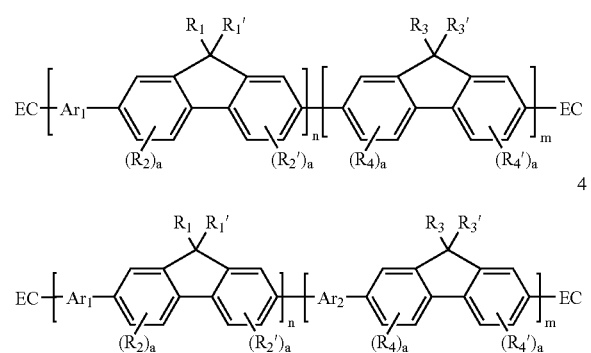

$R_1$, $R_1'$, $R_2$, $R_2'$, EC and a are as described for Formula 1. $R_3$, $R_3'$, $R_4$, $R_4'$ are independently hydrogen, C1–C30 alkyl, C6–C20 aryl, C3–C20 heteroaryl, or C1–C30 hydrocarbyl containing one or more S, N, O, P, or Si atoms. In some embodiments, $R_3$ and $R_3'$ are independently C1–C30 alkyl, C6–C20 aryl, or C3–C20 heteroaryl. In some embodiments, $R_3$ and $R_3'$ are preferably C3 to C15 alkyl.

$Ar_1$ and $Ar_2$ are independently selected from C6–C20 arylene, C2–C20 heteroarylene, and C18–C60 divalent triarylamines. m and n are integers in the range of 2 to 1000. It will be understood that polymers with additional comonomers can be formed using the techniques described above.

Examples of light emitting polymers with soft segment side chains are illustrated in Formula 5:

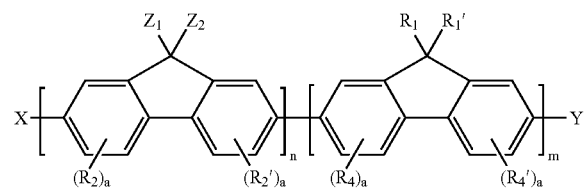

where $R_1$ and $R_1'$ are independently hydrogen, C1–C30 alkyl, C6–C20 aryl, C3–C20 heteroaryl, or C1–C30 hydrocarbyl containing one or more S, N, O, P, or Si atoms; $R_2$, $R_2'$, $R_4$, and $R_4'$ are independently C1–C20 alkyl, C6–C20 aryl, C3–C20 heteroaryl, or C1–C30 hydrocarbyl containing one or more S, N, O, P, or Si atoms; a is independently in each occurrence 0 or 1; and m and n are nonzero integers whose sum (m+n) is in the range of 3 to 1000 and where the ratio n/m is in the range of 0.1 to 3.

X and Y can be any capping group used for polymers including, for example, aryl, heteroaryl, triarylamine, or soft segment end cap groups (EC) as described above with respect to Formula 1. In some embodiments, the polymer is a reactive intermediate to a further polymer. In these instances, one or both of the capping groups can be a reactive group such as a boralane, halo (for example, bromine), or hydroxy group.

In some embodiments, $R_1$ and $R_1'$ are independently C1–C30 alkyl, C6–C20 aryl, or C3–C20 heteroaryl. In some embodiments, $R_1$ and $R_1'$ are preferably C3 to C15 alkyl. In some embodiments, each a is zero.

$Z_1$ and $Z_2$ are independently soft segment side chains having the general formula

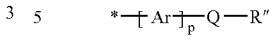

where Ar is arylene or heteroarylene, p is 0 or 1, R″ is alkyl, aryl, or heteroaryl, Q is a soft segment moiety. The soft segment moieties include two or more functional groups selected from ethers, fluoroalkylenes, perfluoroalkylenes, secondary or tertiary amines, thioethers, esters, dialkylsiloxanes, and dialkoxysiloxanes. These functional groups can be the same or different. Suitable soft segment moieties include, for example, poly(oxyalkylene) groups (e.g., —O($C_qH_{2q}$O)$_s$— or —($C_qH_{2q}$O)$_s$— where q is an integer in the range of 1 to 6 and s is an integer in the range of 2 to 20) and poly(dimethylsiloxane) or other poly(dialkylsiloxane) functionalities.

In some embodiments, $Z_1$ and $Z_2$ are the same. In some embodiments, R″ is a sterically hindering functional group such as an aryl, heteroaryl, or a branched alkyl. In other embodiments, R″ is an alkyl, such as methyl, ethyl, or propyl. In some instances, such a functional group may prevent or reduce excimer formation. Preferably, p is 0 and Q is a C2 to C20 poly(oxyalkylene). In some embodiments, the ratio n/m can be used to fine tune the color (including fine tuning the color for white light emission applications), adjust the solubility parameter of the polymer for better thermal transfer, reduce crystallization effects that degrade lifetime, improve or control morphology of thin films or film made by blending the polymer with other agents, or provide any combination of these advantages.

Polymers of Formula 5 can be prepared as random copolymers using the nickel coupling chemistries described above, and capped with monofunctional aryls or soft segment capping groups. In this case, the ratio n/m can be varied by the relative amounts of the two dihalo-functional fluorene monomers used in the reaction. Alternating copolymers can be made using Suzuki coupling methods.

Random copolymers with additional difunctional arylene comonomers $Ar_1$ can be prepared by nickel coupling to give polymers according to Formula 6:

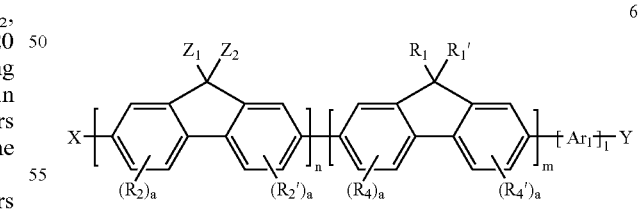

$R_1$, $R_1'$, $R_2$, $R_2'$, $R_4$, $R_4'$, $Z_1$, $Z_2$, X, Y and a are as described for Formula 5. $Ar_1$ is selected from C6–C20 arylene, C2–C20 heteroarylene, and C18–C60 divalent triarylamines. l, m and n are integers in the range of 2 to 1000.

Alternating copolymers and terpolymers with varying mole ratios of one or more reactive conjugated comonomers can be obtained using Suzuki coupling methods as described above. For example, polymers such as those illustrated in Formulas 7, 8, and 9 can be formed.

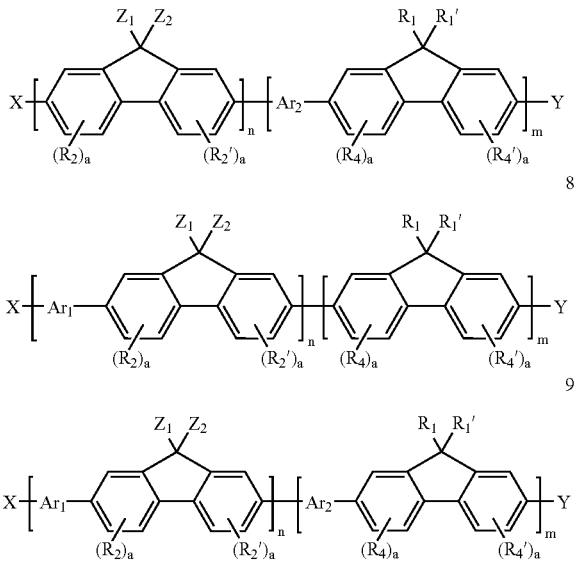

7

8

9

$R_1$, $R_1'$, $R_2$, $R_2'$, $R_4$, $R_4'$, $Z_1$, $Z_2$, X, Y, and a are as described for Formula 5. $Ar_1$ and $Ar_2$ are independently selected from C6–C20 arylene, C2–C20 heteroarylene, and C18–C60 divalent triarylamines. m and n are integers in the range of 2 to 1000. It will be understood that polymers containing monomer units with soft segment side chains can be formed with one, two, three, four, or more comonomers using the techniques described above.

Examples of light emitting polymers with internal soft segments are illustrated in Formulas 10 and 11:

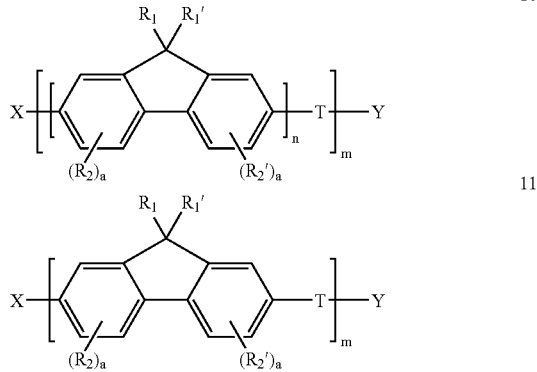

10

11 where $R_1$ and $R_1'$ are independently hydrogen, C1–C30 alkyl, C6–C20 aryl, C3–C20 heteroaryl, or C1–C30 hydrocarbyl containing one or more S, N, O, P, or Si atoms (including soft segment-containing moieties as described above for substituents $Z_1$ and $Z_2$ in Formula 5), $R_2$ and $R_2'$ are independently C1–C20 alkyl, C6–C20 aryl, C3–C20 heteroaryl, or C1–C30 hydrocarbyl containing one or more S, N, O, P, or Si atoms; a is independently in each occurrence 0 or 1; n is an integer in the range of 2 to 600 (preferably in the range of 6 to 200 or 6 to 30), and m is an integer in the range of 2 to 100. X and Y are capping groups as described above with respect to Formula 5. In some embodiments, X and Y are preferably aryl or soft segment end cap groups (EC) as described above with respect to Formula 1.

In some embodiments, $R_1$ and $R_1'$ are independently C1–C30 alkyl, C6–C20 aryl, or C3–C20 heteroaryl. In some embodiments, $R_1$ and $R_1'$ are preferably C3 to C15 alkyl. In some embodiments, each a is zero.

T is an internal soft segment moiety. The soft segment moieties include two or more functional groups selected from alkylenes, ethers, fluoroalkylenes, perfluoroalkylenes, secondary or tertiary amines, thioethers, esters, dialkylsiloxanes, and dialkoxysiloxanes. These functional groups can be the same or different. Suitable soft segment moieties include, for example, oxyalkylene (e.g., $-OC_qH_{2q}O-$ where q is an integer in the range of 1 to 10), poly (oxyalkylene) groups (e.g., $-O(C_qH_{2q}O)_s-$ or $-(C_qH_{2q}O)_s-$ where q is an integer in the range of 1 to 6 and s is an integer in the range of 2 to 20), and poly (dialkylsiloxanes). Preferably, T is a C2 to C20 poly(oxyalkylene). Other examples of particularly suitable soft segment moieties, T, include $-(Ar_3)_w-G-(Ar_4)_v-$ where w and v are 0 or 1, $Ar_3$ and $Ar_4$ are independently selected from C6–C20 arylene and C2–C20 heteroarylene and G includes two or more of the soft segment moieties described above. For example, w and v can be 1, $Ar_3$ and $Ar_4$ can be phenyl or biphenyl, and G can be a poly(oxyalkylene).

Polymers of Formulas 10 and 11 can be prepared, for example, by synthesizing a difunctional reactive oligomer of the desired electroluminescent polymer (for example, a polyfluorene), and then reacting this with a difunctional reactive monomer representing the soft segment. The reactive oligomer of the electroluminescent polymer can be prepared using the nickel coupling chemistries described above or the Suzuki coupling chemistries described above. Reaction of a dihalide terminated oligomer of the electroluminescent polymer can be reacted with a dihalide terminated soft segment monomer using nickel coupling chemistry. Alternatively, the dibromo terminated oligomer of the electroluminescent polymer can be converted to the corresponding diboralane and then polymerized with the dibromine terminated soft segment monomer using Suzuki coupling chemistry. The resulting polymer is an alternating block copolymer and can then be capped with monofunctional arylenes or soft segment capping groups EC. In this case, the ratio of soft-segment and electroluminescent oligomer in the resulting polymer is determined by the molecular weight of the corresponding block oligomers.

Random copolymers with additional difunctional arylene comonomers $Ar_1$ can be prepared by nickel coupling to give polymers according to Formulas 12 and 13:

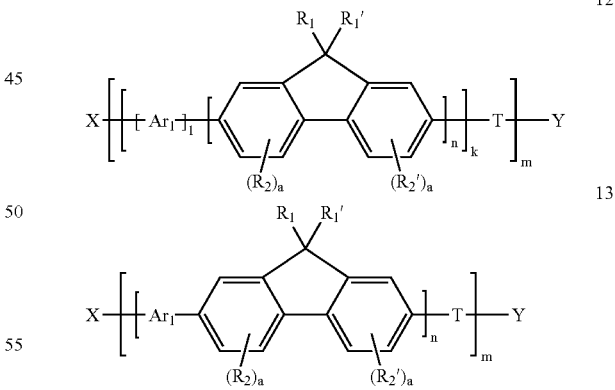

12

13

$R_1$, $R_1'$, $R_2$, $R_2'$, X, Y, T, and a are as described for Formula 10. $Ar_1$ is selected from C6–C20 arylene, C2–C20 heteroarylene, and C18–C60 divalent triarylamines. k, l, m and n are integers in the range of 2 to 1000.

Alternating, block, and random copolymers (including terpolymers) with varying molar ratios of one or more reactive conjugated comonomers can be obtained using Suzuki coupling methods as described above. For example, polymers such as those illustrated in Formulas 14, 15, 16, and 17 can be formed.

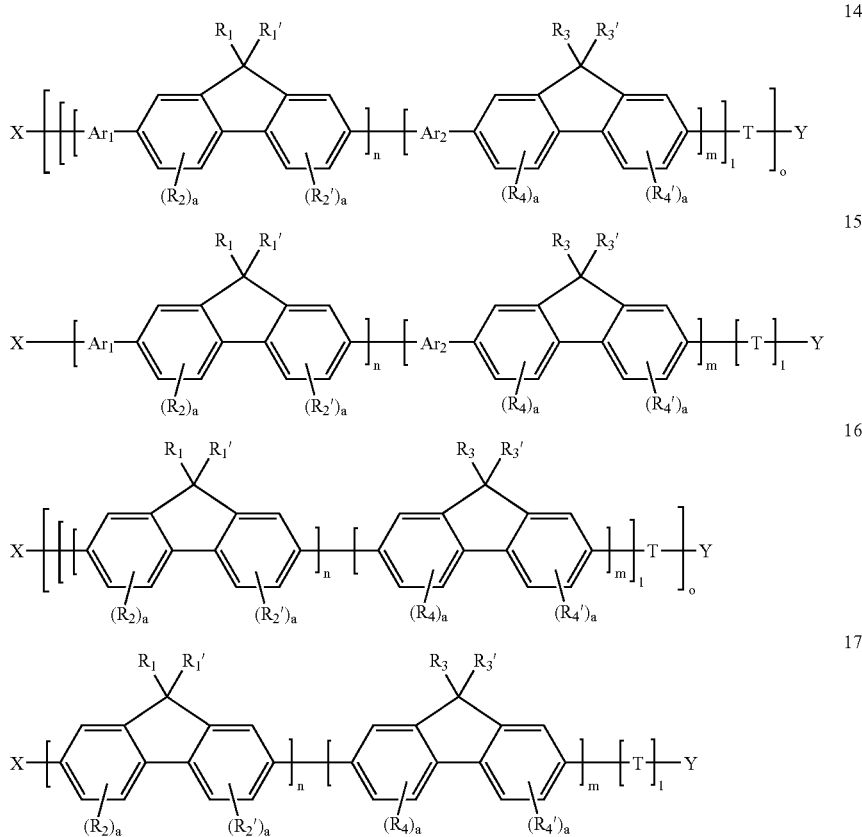

14
15
16
17

$R_1$, $R_1'$, $R_2$, $R_2'$, X, Y, T, and a are as described for Formula 10. $R_3$, $R_3'$, $R_4$, $R_4'$ are independently hydrogen, C1–C30 alkyl, C6–C20 aryl, C3–C20 heteroaryl, or C1–C30 hydrocarbyl containing one or more S, N, O, P, or Si atoms. In some embodiments, $R_3$ and $R_3'$ are independently C1–C30 alkyl, C6–C20 aryl, or C3–C20 heteroaryl. In some embodiments, $R_3$ and $R_3'$ are preferably C3 to C15 alkyl.

$Ar_1$ and $Ar_2$ are independently selected from C6–C20 arylene, C2–C20 heteroarylene, and C18–C60 divalent triarylamines. l, m, n, and o are integers in the range of 2 to 1000. In alternative embodiments, either $Ar_1$ or $Ar_2$ is omitted from Formulas 14 or 15. It will be understood that polymers containing monomer units and internal soft segments can be formed with one, two, three, four, or more comonomers using the techniques described above.

Other light emitting polymers with soft segment end caps, soft segment sidechains, internal soft segments, or combinations thereof can be formed using core arylene ($D_1$ and $D_2$) moieties other than fluorene-type moieties. In other words, in any of Formulas 1–17, one or more of the fluorene moieties can be replaced with another phenylene-type or naphthalene-type moiety, described below, as illustrated in Formulas 1'–17'.

1'

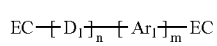

2'

-continued $$EC\!-\!\!\!+\!Ar_1\!-\!D_1\!\!+\!_n\!\!+\!D_2\!+\!_m\!EC$$

3'

$$EC\!-\!\!\!+\!Ar_1\!-\!D_1\!\!+\!_n\!\!+\!Ar_2\!-\!D_2\!+\!_m\!EC$$

4'

$$X\!-\!\!+\!\!\overset{[Z_1]_q}{D_1}\!\!+\!_n\!\!+\!D_2\!+\!_m\!Y$$

5'

$$X\!-\!\!+\!Ar_1\!+\!_l\!\!+\!\overset{[Z_1]_q}{D_1}\!\!+\!_n\!\!+\!D_2\!+\!_m\!Y$$

6'

$$X\!-\!\!+\!\overset{[Z_1]_q}{D_1}\!\!+\!_n\!\!+\!Ar_2\!-\!D_2\!+\!_m\!Y$$

7'

$$X\!-\!\!+\!Ar_1\!-\!\overset{[Z_1]_q}{D_1}\!\!+\!_n\!\!+\!D_2\!+\!_m\!Y$$

8'

$$X\!-\!\!+\!Ar_1\!-\!\overset{[Z_1]_q}{D_1}\!\!+\!_n\!\!+\!Ar_2\!-\!D_2\!+\!_m\!Y$$

9'

$$X\!-\!\!+\!\!+\!D_1\!+\!_n\!\!+\!T\!+\!_m\!Y$$

10'

$$X\!-\!\!+\!D_1\!-\!\!-\!T\!+\!_m\!Y$$

11'

$$X\!-\!\!+\!\!+\!\!+\!Ar_1\!+\!_l\!\!+\!D_1\!+\!_n\!+\!_k\!T\!+\!_m\!Y$$

12'

-continued

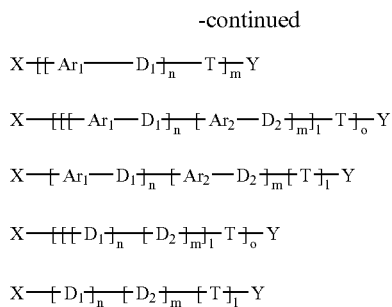

EC, T, X, Y, Ar$_1$, Ar$_2$, Z$_1$, l, m, n, o, and q are as described above for the respective Formulas 1–17.

D$_1$ and D$_2$ are arylene moieties, such as phenylene-type moieties and naphthalene-type moieties. Phenylene-type moieties include any divalent unsaturated aromatic carbocyclic units having one, two, or three conjugated phenylene rings (for example, phenylene, biphenylene, and triphenylene) where, optionally, two or more of the phenylene rings are fused together with a divalent alkylene, dialkylsilylene, or diarylsilylene moiety. Examples of such groups include benzene-1,3-diyl, benzene-1,4-diyl, 5,6-dihydrophenathren-3,8-diyl, 4,5,9,10-tetrahydropyren-2,7-diyl, fluoren-2,7-diyl, 9-silafluoren-2,7-diyl, spirobisfluoren-2,7-diyl, 6,12-dihydroindeno[1,2-b]fluorene-2,8-diyl, 5,6,12,13-tetrahydrodibenzo[a,h]anthracene-3,10-diyl, 5,12-dihydro-6H-indeno[1,2-b]phenanthrene-3,10-diyl, and the like. Structural examples of phenylene-type moieties include, for example:

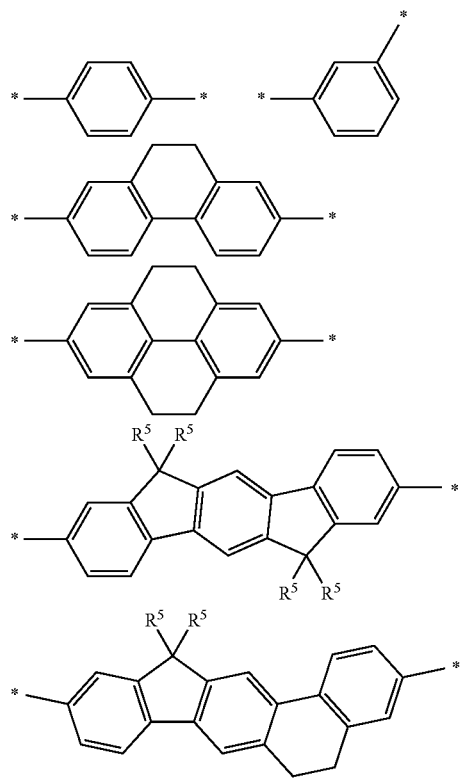

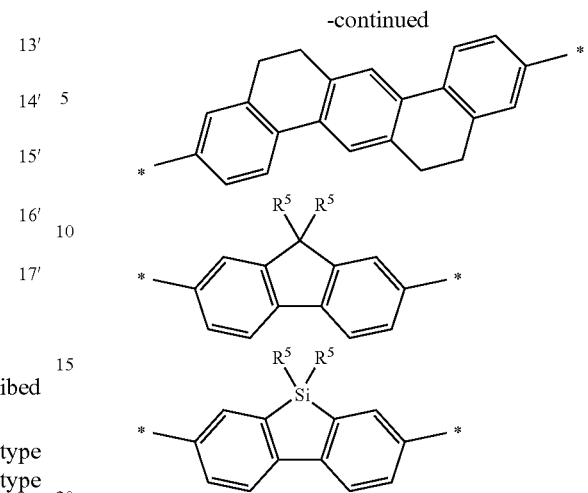

where R$^5$ is independently in each case hydrogen, C1–C30 alkyl, C1–C30 alkenyl, C6–C20 aryl, C3–C20 heteroaryl, or C1–C30 hydrocarbyl containing one or more S, N, O, P, or Si atoms and where any of the aromatic or aliphatic rings can be independently substituted one or more times with fluoro, C1–C20 fluoroalkyl, C1–C20 perfluoroalkyl, C1–C20 alkyl, C1–C20 alkenyl, C6–C20 aryl, C3–C20 heteroaryl, or C1–C30 hydrocarbyl containing one or more S, N, O, P, or Si atoms.

Naphthalene-type moieties include any divalent unsaturated aromatic carbocyclic radicals having a fused naphthalene ring structure. Examples of preferred "naphthalene-type moieties" as used herein include naphthalene-2,7-diyl, naphthalene-2,6-diyl, naphthalene-1,4-diyl, and naphthalene-1,5-diyl. Structural examples of naphthalene-type moieties include, for example:

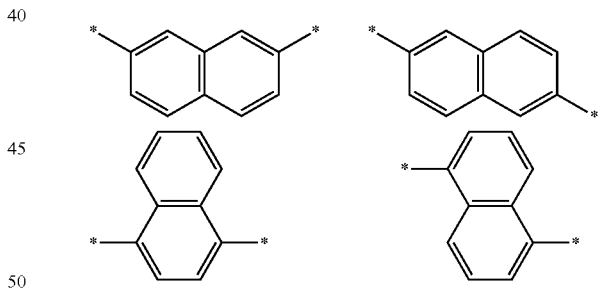

Any of the aromatic rings can be independently substituted one or more times with fluoro, C1–C20 fluoroalkyl, C1–C20 perfluoroalkyl, C1–C20 alkyl, C1–C20 alkenyl, C6–C20 aryl, C3–C20 heteroaryl, or C1–C30 hydrocarbyl containing one or more S, N, O, P, or Si atoms.

It will be understood that polymers containing the above-described core arylene moieties, soft segment end caps, soft segment side chains, and internal soft segments can be formed with one, two, three, four, or more comonomers using the techniques described above.

Unless otherwise indicated, the term "alkyl" includes both straight-chained, branched, and cyclic alkyl groups and includes both unsubstituted and substituted alkyl groups. Unless otherwise indicated, the alkyl groups are typically C1–C20. Examples of "alkyl" as used herein include, but are not limited to, methyl, ethyl, n-propyl, n-butyl, n-pentyl, isobutyl, and isopropyl, and the like.

Unless otherwise indicated, the term "alkylene" includes both straight-chained, branched, and cyclic divalent hydrocarbon radicals and includes both unsubstituted and substituted alkenylene groups. Unless otherwise indicated, the alkylene groups are typically C1–C20. Examples of "alkylene" as used herein include, but are not limited to, methylene, ethylene, propylene, butylene, and isopropylene, and the like.

Unless otherwise indicated, the term "aryl" refers to monovalent unsaturated aromatic carbocyclic radicals having one to fifteen rings, such as phenyl or biphenyl, or multiple fused rings, such as naphthyl or anthryl, or combinations thereof. Examples of aryl as used herein include, but are not limited to, phenyl, 2-naphthyl, 1-naphthyl, acenaphthyl, phenanthryl, anthracenyl, fluoranthenyl, pyrenyl, rubrenyl, chrysenyl, biphenyl, 2-hydroxyphenyl, 2-aminophenyl, 2-methoxyphenyl and the like.

Unless otherwise indicated, the term "arylene" refers to divalent unsaturated aromatic carbocyclic radicals having one to fifteen rings, such as phenylene, or multiple fused rings, such as naphthylene or anthrylene, or combinations thereof. Examples of "arylene" as used herein include, but are not limited to, benzene-1,2-diyl, benzene-1,3-diyl, benzene-1,4-diyl, naphthalene-1,8-diyl, anthracene-1,4-diyl, and the like.

Unless otherwise indicated, the term "heteroaryl" refers to functional groups containing a monovalent five- to seven-membered aromatic ring radical with one or more heteroatoms independently selected from S, O, or N. Such a heteroaryl ring may be optionally fused to one or more of another heterocyclic ring(s), heteroaryl ring(s), aryl ring(s), cycloalkenyl ring(s), or cycloalkyl rings. Examples of "heteroaryl" used herein include, but are not limited to, furyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuryl, benzothiophenyl, indolyl, carbazoyl, benzoxazolyl, benzothiazolyl, benzimidazolyl, cinnolinyl, quinazolinyl, quinoxalinyl, phthalazinyl, benzothiadiazolyl, benzotriazinyl, phenazinyl, phenanthridinyl, acridinyl, and indazolyl, and the like.

Unless otherwise indicated, the term "heteroarylene" refers to functional groups containing a divalent five to seven membered aromatic ring radical with one or more heteroatoms independently selected from S, O, or N. Such a heteroarylene ring may be optionally fused to one or more of another heterocyclic ring(s), heteroaryl ring(s), aryl ring(s), cycloalkenyl ring(s), or cycloalkyl rings. Examples of "heteroarylene" used herein include, but are not limited to, furan-2,5-diyl, thiophene-2,4-diyl, 1,3,4-oxadiazole-2,5-diyl, 1,3,4-thiadiazole-2,5-diyl, 1,3-thiazole-2,4-diyl, 1,3-thiazole-2,5-diyl, pyridine-2,4-diyl, pyridine-2,3-diyl, pyridine-2,5-diyl, pyrimidine-2,4-diyl, quinoline-2,3-diyl, and the like.

Unless otherwise indicated, the term "triarylamine" refers to a class of divalent or monovalent functional groups comprising one or more tertiary nitrogen centers, each bonded to three aryl or arylene groups. Examples of suitable "triarylamines" used herein include the monovalent or divalent forms of diarylanilines, alkylcarbazoles, arylcarbazoles, tetraaryldiamines such as N,N,N'N'-tetraarylbenzidines, N,N,N',N'-tetraaryl-1,4-phenylenediamines, N,N,N'N'-tetraryl-2,7-diaminofluorene derivatives such as those taught in European Patent Application Publication No. 0 953 624 and European Patent Application Publication No. 0 879 868 (both incorporated herein by reference), N,N'-bis(3-methylphenyl)-N,N'-bis(phenyl)benzidine (also known as TPD), N,N'-diphenyl-N,N'-bis(1-naphthylphenyl)-1,1'-biphenyl-4, 4'-diamine (also known as NPB), N,N'-dicarbazole-biphenyl (also known as CBP), other tetraaryldiamine derivatives such as those described in Koene et al., *Chem. Mater.* 10, 2235–2250 (1998), incorporated herein by reference, and in U.S. Pat. Nos. 5,792,557 and 5,550,290, and European Patent Application Publication No. 0891121, all of which are incorporated herein by reference; peraryltriamine derivatives such as those described in U.S. Pat. No. 6,074,734 and EP 0827367, both of which are incorporated herein by reference, starburst amine derivatives such as 4,4',4''-tris(N, N-diarylamino)triphenylamines and 1,3,5-tris(4-(N,N-diarylamino)phenyl)benzenes, 4,4',4''-tris(N,N-diphenylamino) triphenylamine (also known as TDATA), 1,3,5-tris(4-(N,N-diphenylamino)phenyl)benzenes (TDAPBs), and other dendridic and spiro amine derivatives as taught in European Patent Application Publication No. 0650955; Tokito et al., *Polym. Prep.* (Am. Chem. Soc. Div. Polym. Chem.) 38(1), 388–389, (1997); Tanake et al., *Chem. Commun.* 2175–2176 (1996); and Tokito et al., *Appl. Phys. Lett.* 70(15), 1929–1931 (1997), all of which are incorporated herein by reference.

Unless otherwise indicated, all alkyl, alkylene, aryl, arylene, heteroaryl, heteroarylene, and triarylamine groups can be unsubstituted or substituted with one or more substituents. Suitable substituents for substituted alkyl, alkylene, aryl, arylene, heteroaryl, heteroarylene, and triarylamine groups include, but are not limited to, alkyl, alkylene, alkoxy, aryl, arylene, heteroaryl, heteroarylene, aryloxy, thioalkyl, thioaryl, amino, F, Cl, cyano, nitro, and —COO-alkyl.

Light emitting layers based on LEP materials have been fabricated by solution coating a thin layer of the material as described, for example, in U.S. Pat. No. 5,408,109, incorporated herein by reference.

Another method of forming devices includes the transfer of one or more transfer layers by laser thermal patterning as described in, for example, U.S. Pat. Nos. 6,358,664; 6,284, 425; 6,242,152; 6,228,555; 6,228,543; 6,221,553; 6,221, 543; 6,214,520; 6,194,119; 6,114,088; 5,998,085; 5,725, 989; 5,710,097; 5,695,907; and 5,693,446, and in U.S. patent applications Ser. Nos. 09/844,695; 09/844,100; 09/662,980; 09/451,984; 09/931,598; and 10/004,706, all of which are incorporated herein by reference. The patterning process can depend upon the physical properties of the transfer layer.

One parameter is the cohesive, or film strength, of the transfer layer. During imaging, the transfer layer preferably breaks cleanly along the line dividing imaged and unimaged regions to form the edge of a pattern. Highly conjugated polymers which exist in extended chain conformations, such as polyphenylenevinylenes, can have high tensile strengths and elastic moduli comparable to that of polyamide fibers. In practice, clean edge formation during the laser thermal imaging of light emitting polymers can be challenging. The undesired consequence of poor edge formation is rough, torn, or ragged edges on the transferred pattern. Another parameter is the strength of the bond formed between the transfer layer and the receptor surface. This strength may be influenced by the solubility parameter compatibility of the transfer layer and the receptor surface.

Laser thermal transfer will be used as an example of a method for forming light emitting and other layers, however, it will be recognized that other transfer, patterning, and printing techniques can be used, such as inkjet printing, screen printing, thermal head printing, and photolithographic patterning.

Referring back to FIG. 1, device layer 110 is disposed on substrate 120. Substrate 120 can be any substrate suitable for OEL device and display applications. For example, substrate 120 can comprise glass, clear plastic, or other suitable material(s) that are substantially transparent to visible light. Substrate 120 can also be opaque to visible light, for example stainless steel, crystalline silicon, polysilicon, or the like. Because some materials in OEL devices can be particularly susceptible to damage due to exposure to oxygen or water, substrate 120 preferably provides an adequate environmental barrier, or is supplied with one or more layers, coatings, or laminates that provide an adequate environmental barrier.

Substrate 120 can also include any number of devices or components suitable in OEL devices and displays such as transistor arrays and other electronic devices; color filters, polarizers, wave plates, diffusers, and other optical devices; insulators, barrier ribs, black matrix, mask work and other such components; and the like. Generally, one or more electrodes will be coated, deposited, patterned, or otherwise disposed on substrate 120 before forming the remaining layer or layers of the OEL device or devices of the device layer 110. When a light transmissive substrate 120 is used and the OEL device or devices are bottom emitting, the electrode or electrodes that are disposed between the substrate 120 and the emissive material(s) are preferably substantially transparent to light, for example transparent conductive electrodes such as indium tin oxide (ITO) or any of a number of other transparent conductive oxides.

Element 130 can be any element or combination of elements suitable for use with OEL display or device 100. For example, element 130 can be an LCD module when device 100 is a backlight. One or more polarizers or other elements can be provided between the LCD module and the backlight device 100, for instance an absorbing or reflective clean-up polarizer. Alternatively, when device 100 is itself an information display, element 130 can include one or more of polarizers, wave plates, touch panels, antireflective coatings, anti-smudge coatings, projection screens, brightness enhancement films, or other optical components, coatings, user interface devices, or the like.

Organic electronic devices containing materials for light emission can be made at least in part by selective thermal transfer of light emitting material from a thermal transfer donor sheet to a desired receptor substrate. For example, light emitting polymer displays and lamps can be made coating an LEP on a donor sheet and then selectively transferring the LEP layer alone or along with other device layers or materials to the display substrate.

Figure 2:
FIG. 2 is a schematic side view of a donor sheet for transferring materials according to the present invention.

Selective thermal transfer of layers containing light emitting materials for organic electronic devices can be performed using a thermal transfer donor. FIG. 2 shows an example of a thermal transfer donor 200 suitable for use in the present invention. Donor element 200 includes a base substrate 210, an optional underlayer 212, an optional light-to-heat conversion layer (LTHC layer) 214, an optional interlayer 216, and a transfer layer 218. Each of these elements are described in more detail in the discussion that follows. Other layers can also be present. Examples of suitable donors or layers of donors are disclosed in U.S. Pat. Nos. 6,358,664; 6,284,425; 6,242,152; 6,228,555; 6,228,543; 6,221,553; 6,221,543; 6,214,520; 6,194,119; 6,114,088; 5,998,085; 5,725,989; 5,710,097; 5,695,907; and 5,693,446, and in U.S. patent applications Ser. Nos. 09/844,695; 09/844,100; 09/662,980; 09/451,984; 09/931,598; and 10/004,706, all of which are incorporated herein by reference.

In processes of the present invention, emissive organic materials, including LEPs or other materials, can be selectively transferred from the transfer layer of a donor sheet to a receptor substrate by placing the transfer layer of the donor element adjacent to the receptor and selectively heating the donor element. Illustratively, the donor element can be selectively heated by irradiating the donor element with imaging radiation that can be absorbed by light-to-heat converter material disposed in the donor, often in a separate LTHC layer, and converted into heat. In these cases, the donor can be exposed to imaging radiation through the donor substrate, through the receptor, or both. The radiation can include one or more wavelengths, including visible light, infrared radiation, or ultraviolet radiation, for example from a laser, lamp, or other such radiation source. Other selective heating methods can also be used, such as using a thermal print head or using a thermal hot stamp (e.g., a patterned thermal hot stamp such as a heated silicone stamp that has a relief pattern that can be used to selectively heat a donor). Material from the thermal transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the donor sheet, or the materials of the donor sheet. The transferred pattern can also be controlled by irradiating the donor element through a mask.

As mentioned, a thermal print head or other heating element (patterned or otherwise) can also be used to selectively heat the donor element directly, thereby patternwise transferring portions of the transfer layer. In such cases, the light-to-heat converter material in the donor sheet is optional. Thermal print heads or other heating elements may be particularly suited for making lower resolution patterns of material or for patterning elements whose placement need not be precisely controlled.

Transfer layers can also be transferred from donor sheets without selectively transferring the transfer layer. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

The mode of thermal mass transfer can vary depending on the type of selective heating employed, the type of irradiation if used to expose the donor, the type of materials and properties of the optional LTHC layer, the type of materials in the transfer layer, the overall construction of the donor, the type of receptor substrate, and the like. Without wishing to be bound by any theory, transfer generally occurs via one or more mechanisms, one or more of which may be emphasized or de-emphasized during selective transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby selective heating of a donor sheet can be used to cause the transfer of materials from a transfer layer to receptor surface.

A variety of radiation-emitting sources can be used to heat donor sheets. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and irradiation conditions can be suitable based on, among other things, the donor element construction, the transfer layer material, the mode of thermal mass transfer, and other such factors.

When high spot placement accuracy is desired (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 µm thick polyimide sheets).

During imaging, the donor sheet can be brought into intimate contact with a receptor (as might typically be the case for thermal melt-stick transfer mechanisms) or the donor sheet can be spaced some distance from the receptor (as can be the case for ablative transfer mechanisms or material sublimation transfer mechanisms). In at least some instances, pressure or vacuum can be used to hold the donor sheet in intimate contact with the receptor. In some instances, a mask can be placed between the donor sheet and the receptor. Such a mask can be removable or can remain on the receptor after transfer. If a light-to-heat converter material is present in the donor, radiation source can then be used to heat the LTHC layer (or other layer(s) containing radiation absorber) in an imagewise fashion (e.g., digitally or by analog exposure through a mask) to perform imagewise transfer or patterning of the transfer layer from the donor sheet to the receptor.

Typically, selected portions of the transfer layer are transferred to the receptor without transferring significant portions of the other layers of the donor sheet, such as the optional interlayer or LTHC layer. The presence of the optional interlayer may eliminate or reduce the transfer of material from an LTHC layer to the receptor or reduce distortion in the transferred portion of the transfer layer. Preferably, under imaging conditions, the adhesion of the optional interlayer to the LTHC layer is greater than the adhesion of the interlayer to the transfer layer. The interlayer can be transmissive, reflective, or absorptive to imaging radiation, and can be used to attenuate or otherwise control the level of imaging radiation transmitted through the donor or to manage temperatures in the donor, for example to reduce thermal or radiation-based damage to the transfer layer during imaging. Multiple interlayers can be present.

Large donor sheets can be used, including donor sheets that have length and width dimensions of a meter or more. In operation, a laser can be rastered or otherwise moved across the large donor sheet, the laser being selectively operated to illuminate portions of the donor sheet according to a desired pattern. Alternatively, the laser may be stationary and the donor sheet or receptor substrate moved beneath the laser.

In some instances, it may be necessary, desirable, or convenient to sequentially use two or more different donor sheets to form electronic devices on a receptor. For example, multiple layer devices can be formed by transferring separate layers or separate stacks of layers from different donor sheets. Multilayer stacks can also be transferred as a single transfer unit from a single donor element. For example, a hole transport layer and a LEP layer can be co-transferred from a single donor. As another example, a semiconductive polymer and an emissive layer can be co-transferred from a single donor. Multiple donor sheets can also be used to form separate components in the same layer on the receptor. For example, three different donors that each have a transfer layer comprising a LEP capable of emitting a different color (for example, red, green, and blue) can be used to form RGB sub-pixel OEL devices for a full color polarized light emitting electronic display. As another example, a conductive or semiconductive polymer can be patterned via thermal transfer from one donor, followed by selective thermal transfer of emissive layers from one or more other donors to form a plurality of OEL devices in a display. As still another example, layers for organic transistors can be patterned by selective thermal transfer of electrically active organic materials (oriented or not), followed by selective thermal transfer patterning of one or more pixel or sub-pixel elements such as color filters, emissive layers, charge transport layers, electrode layers, and the like.

Materials from separate donor sheets can be transferred adjacent to other materials on a receptor to form adjacent devices, portions of adjacent devices, or different portions of the same device. Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). A variety of other combinations of two or more donor sheets can be used to form a device, each donor sheet forming one or more portions of the device. It will be understood that other portions of these devices, or other devices on the receptor, may be formed in whole or in part by any suitable process including photolithographic processes, ink jet processes, and various other printing or mask-based processes, whether conventionally used or newly developed.

Referring back to FIG. 2, various layers of the donor sheet 200 will now be described.

The donor substrate 210 can be a polymer film. One suitable type of polymer film is a polyester film, for example, polyethylene terephthalate (PET) or polyethylene naphthalate (PEN) films. However, other films with sufficient optical properties, including high transmission of light at a particular wavelength, or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor. However, as described below, the inclusion of an underlayer between the substrate and an LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an optional adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers.

An optional underlayer 212 may be coated or otherwise disposed between a donor substrate and the LTHC layer, for example to control heat flow between the substrate and the LTHC layer during imaging or to provide mechanical stability to the donor element for storage, handling, donor processing, or imaging. Examples of suitable underlayers and methods of providing underlayers are disclosed in U.S. Pat. No. 6,284,425, incorporated herein by reference.

The underlayer can include materials that impart desired mechanical or thermal properties to the donor element. For example, the underlayer can include materials that exhibit a low value for the product of specific heat and density or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation or reflection of imaging radiation by the underlayer may be used to control heat generation during imaging.

Referring again to FIG. 2, an LTHC layer 214 can be included in donor sheets of the present invention to couple irradiation energy into the donor sheet. The LTHC layer preferably includes a radiation absorber that absorbs incident radiation (e.g., laser light) and converts at least a portion of the incident radiation into heat to enable transfer of the transfer layer from the donor sheet to the receptor.

Generally, the radiation absorber(s) in the LTHC layer absorb light in the infrared, visible, or ultraviolet regions of the electromagnetic spectrum and convert the absorbed radiation into heat. The radiation absorber(s) are typically highly absorptive of the selected imaging radiation, providing a LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in U.S. Pat. No. 6,228,555, non-homogeneous LTHC layers can be used to control temperature profiles in donor elements. This can give rise to donor sheets that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 μm or less, and may be about 1 μm or less. Suitable dyes include those dyes that absorb in the IR region of the spectrum. A specific dye may be chosen based on factors such as, solubility in, and compatibility with, a specific binder or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{29}$) may also be used.

Metal radiation absorbers may be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers or oligomers with optional polymer.

The inclusion of a thermoplastic resin (e.g., polymer) may improve, in at least some instances, the performance (e.g., transfer properties or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$ (about 18 to 26 $(J/cm^3)^{1/2}$), preferably, 9.5 to 12 $(cal/cm^3)^{1/2}$ (about 19 to 24 $(J/cm^3)^{1/2}$), is chosen for the binder Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer can be coated, in at least some instances, to a thickness of 0.05 µm to 20 µm, preferably, 0.5 µm to 10 µm, and, more preferably, 1 µm to 7 µm. An inorganic LTHC layer can be coated, in at least some instances, to a thickness in the range of 0.0005 to 10 µm, and preferably, 0.001 to 1 µm.

Referring again to FIG. 2, an optional interlayer 216 may be disposed between the LTHC layer 214 and transfer layer 218. The interlayer can be used, for example, to minimize damage and contamination of the transferred portion of the transfer layer and may also reduce distortion in the transferred portion of the transfer layer. The interlayer may also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, die coating, or extrusion coating). Typically, the glass transition temperature ($T_g$) of thermoplastic materials suitable for use in the interlayer is 25° C. or greater, preferably 50° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the donor sheet to imaging radiation. For polymer interlayers, the thickness of the interlayer typically is in the range of 0.05 µm to 10 µm. For inorganic interlayers (e.g., metal or metal compound interlayers), the thickness of the interlayer typically is in the range of 0.005 µm to 10 µm.

Referring again to FIG. 2, a thermal transfer layer 218 is included in donor sheet 200. Transfer layer 218 can include any suitable material or materials, disposed in one or more layers, alone or in combination with other materials. Transfer layer 218 is capable of being selectively transferred as a unit or in portions by any suitable transfer mechanism when the donor element is exposed to direct heating or to imaging radiation that can be absorbed by light-to-heat converter material and converted into heat.

The present invention contemplates a transfer layer that includes a LEP as the light emitting material. One way of providing the transfer layer is by solution coating the light emitting material onto the donor. In this method, the light emitting material can be solubilized by addition of a suitable compatible solvent, and coated onto the donor sheet by spin-coating, gravure coating, Mayer rod coating, knife coating, die coating, and the like. The solvent chosen preferably does not undesirably interact with (e.g., swell or dissolve) any of the already existing layers in the donor sheet. The coating can then be annealed and the solvent evaporated to leave a transfer.

The transfer layer can then be selectively thermally transferred from the donor element to a proximately located receptor substrate. There can be, if desired, more than one transfer layer so that a multilayer construction is transferred using a single donor sheet. The receptor substrate may be any item suitable for a particular application including, but not limited to, glass, transparent films, reflective films, metals, semiconductors, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide or are circuitized with low temperature polysilicon (LTPS) or other transistor structures, including organic transistors.

Suitable flexible substrates include substantially clear and transmissive polymer films, reflective films, transflective films, polarizing films, multilayer optical films, and the like. Flexible substrates can also be coated or patterned with electrode materials or transistors, for example transistor arrays formed directly on the flexible substrate or transferred to the flexible substrate after being formed on a temporary carrier substrate. Suitable polymer substrates include polyester substrates (e.g., polyethylene terephthalate, polyethylene naphthalate), polycarbonate substrates, polyolefin substrates, polyvinyl substrates (e.g., polyvinyl chloride, polyvinylidene chloride, polyvinyl acetals, etc.), cellulose ester substrates (e.g., cellulose triacetate, cellulose acetate), and other conventional polymeric films used as supports. For making OELs on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, hole transport layers, electron transport layers, and other elements useful for electronic displays or other devices.

Figure 3:
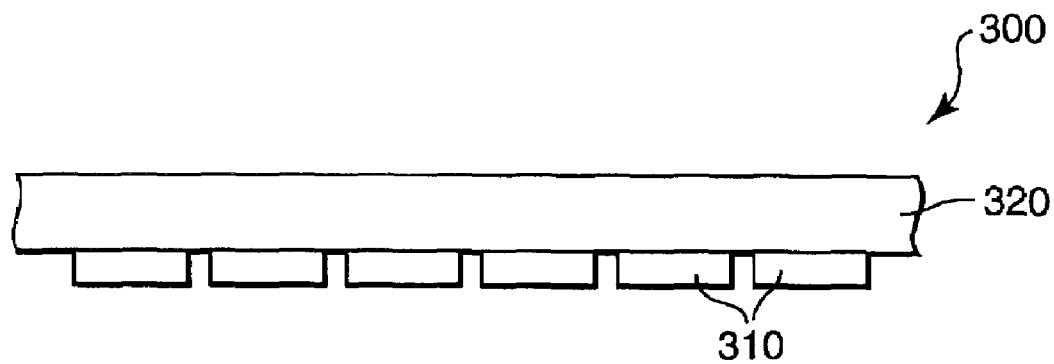
FIG. 3 is a schematic side view of an organic electroluminescent display according to the present invention.
Figure 4A:
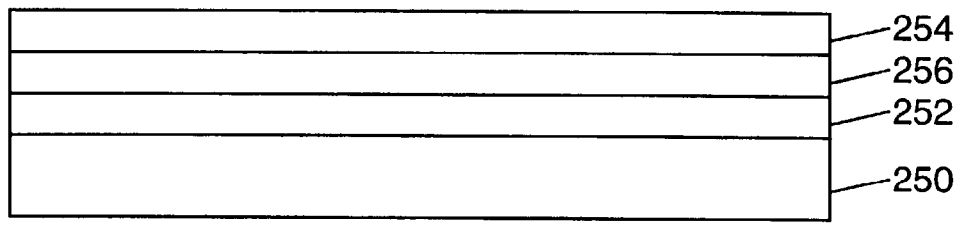
FIG. 4A is a schematic side view of a first embodiment of an organic electroluminescent device.
Figure 4B:
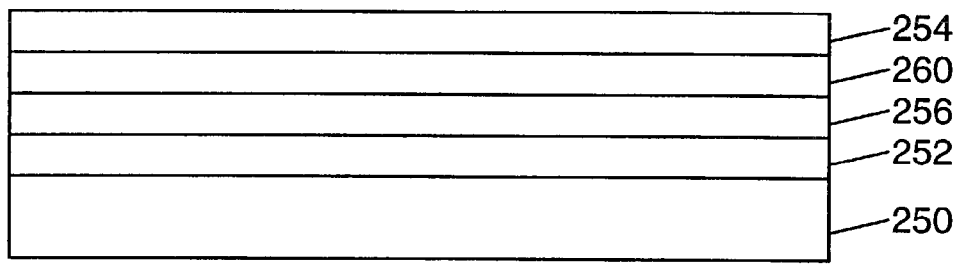
FIG. 4B is a schematic side view of a second embodiment of an organic electroluminescent device.
Figure 4C:
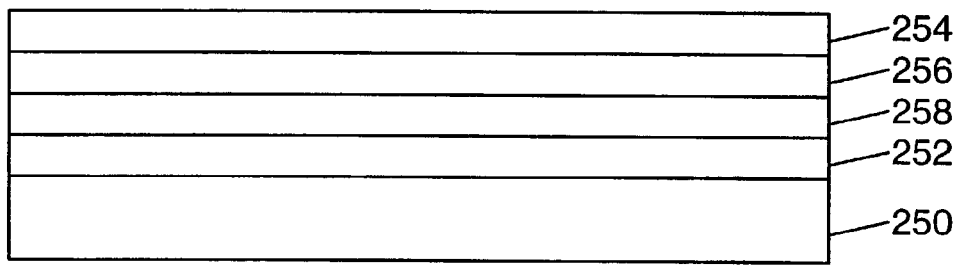
FIG. 4C is a schematic side view of a third embodiment of an organic electroluminescent device.
Figure 4D:
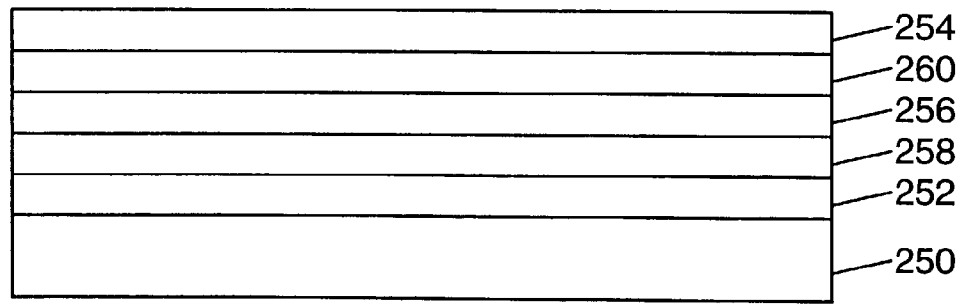
FIG. 4D is a schematic side view of a fourth embodiment of an organic electroluminescent device.

The present invention contemplates light emitting OEL displays and devices. In one embodiment, OEL displays can be made that emit light and that have adjacent devices that can emit light having different color. For example, FIG. 3 shows an OEL display 300 that includes a plurality of OEL devices 310 disposed on a substrate 320. Adjacent devices 310 can be made to emit different colors of light.

The separation shown between devices 310 is for illustrative purposes only. Adjacent devices may be separated, in contact, overlapping, etc., or different combinations of these in more than one direction on the display substrate. For example, a pattern of parallel striped transparent conductive anodes can be formed on the substrate followed by a striped pattern of a hole transport material and a striped repeating pattern of red, green, and blue light emitting LEP layers, followed by a striped pattern of cathodes, the cathode stripes oriented perpendicular to the anode stripes. Such a construction may be suitable for forming passive matrix displays. In other embodiments, transparent conductive anode pads can be provided in a two-dimensional pattern on the substrate and associated with addressing electronics such as one or more transistors, capacitors, etc., such as are suitable for making active matrix displays. Other layers, including the light emitting layer(s) can then be coated or deposited as a single layer or can be patterned (e.g., parallel stripes, two-dimensional pattern commensurate with the anodes, etc.) over the anodes or electronic devices. Any other suitable construction is also contemplated by the present invention.

In one embodiment, display 300 can be a multiple color display. As such, it may be desirable to position optional polarizer 330 between the light emitting devices and a viewer, for example to enhance the contrast of the display. In exemplary embodiments, each of the devices 310 emits light. There are many displays and devices constructions covered by the general construction illustrated in FIG. 3. Some of those constructions are discussed as follows.

OEL backlights can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include white or single color large area single pixel lamps, for example where an emissive material is provided by thermal stamp transfer, lamination transfer, resistive head thermal printing, or the like; white or single color large area single electrode pair lamps that have a large number of closely spaced emissive layers patterned by laser induced thermal transfer; and tunable color multiple electrode large area lamps.

Low resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

High resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include active or passive matrix multicolor or full color displays; active or passive matrix multicolor or full color displays plus segmented or graphic indicator lamps (e.g., laser induced transfer of high resolution devices plus thermal hot stamp of icons on the same substrate); and security display applications.

EXAMPLES

Unless otherwise indicated, the chemicals used in the following Examples can be obtained from Aldrich Chemical Co., Milwaukee, Wis. Tetrakis(triphenylphosphine) palladium(0) and bis(1,5-cyclooctadiene)nickel(0) are available from Strem Chemicals, Inc., Newburyport, Mass. 4,4,5,5-Tetramethyl-2-phenyl-1,3,2-dioxaborolane can be prepared according to Ishiyama et al., *Tetrahedron Lett.*, 1997, 3447–3450, incorporated herein by reference.

Example 1

Synthesis of 1,2-bis[β,β'-(p-bromophenoxy)ethoxy] ethane (18)

1,2-bis[β,β'-(p-bromophenoxy)ethoxy]ethane (18) was prepared following procedures outlined in *J. Org. Chem* 45, 1156 (1980), incorporated herein by reference.

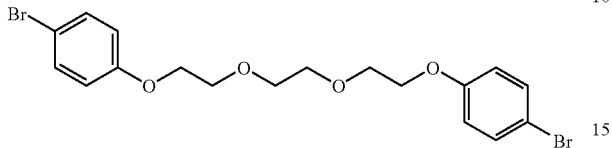

p-Bromophenol (186.8 g) and sodium hydroxide (43.2 g) were added to 325 mL of dimethyl sulfoxide (DMSO) and stirred at 60° C. for 2 hrs under nitrogen. 1,2,-Bis(2-chloroethoxy)ethane (45.09 g) in 108 mL of degassed DMSO was then added drop wise at 60° C. The resulting mixture was heated to 90° C. overnight, cooled to room temperature, and mixed with 2 liters of water to yield a pale brown precipitate that was isolated by filtration, and recrystallized from methanol to give 85 grams (95% yield) of the desired product as determined by $^1$H-NMR.

Example 2

Synthesis of 4,7-Dibromobenzo[1,2,5]thiadiazole (19)

4,7-Dibromobenzo[1,2,5]thiadiazole (19) was made as outlined in *J. Heterocycl. Chem.* 7, 629–633 (1970), incorporated herein by reference.

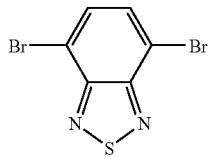

Example 3

Synthesis of 9,9-Dioctyl-2,7-bis(4,4,5,5-tetramethyl-1,3,2-dioxaborolan-2-yl)-fluorene (20)

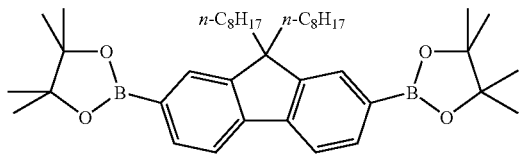

9,9-Dioctyl-2,7-bis(4,4,5,5-tetramethyl-1,3,2-dioxaborolan-2-yl)-fluorene (20) was made according to *Chem. Commun.*, 1997, 1597–1598, incorporated herein by reference.

Example 4

Synthesis of 9,9-dioctyl-2,7-dibromo-fluorene (21)

9,9-Dioctyl-2,7-dibromo-fluorene (21) was made according to *Can. J. Chem.* 1998, 1571–1577, incorporated herein by reference.

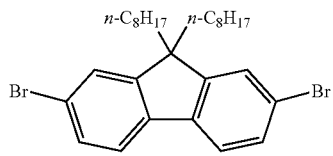

Example 5

Synthesis of 2,7-dibromo-9,9-bis(3,6-dioxahexyl-6-phenyl)-fluorene (22)

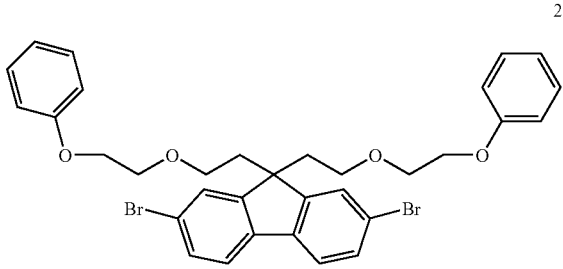

2,7-Dibromo-9,9-bis(3,6-dioxahexyl-6-phenyl)-fluorene (22) was synthesized from PhO(CH$_2$)$_2$O(CH$_2$)$_2$I and 2,7-dibromofluorene following the general procedure as demonstrated in the synthesis of 2,7-dibromo-9,9-bis(3,6-dioxaheptyl)-fluorene(23) as described in Example 6.

Example 6

Synthesis of 2,7-dibromo-9,9-bis(3,6-dioxaheptyl)-fluorene (23)

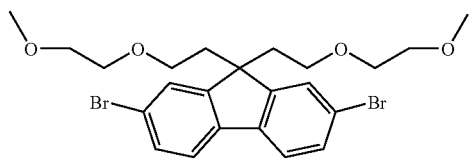

Benzyltriethylammonium chloride (3.19 g, 14 mmole, 0.077 equiv.) and 2,7-dibromofluorene (59 g, 182 mmole, 1 equiv.) were suspended in 178 mL DMSO. 50% aqueous NaOH (80 mL) was added. 1-Bromo-2-(2-methoxyethoxy) ethane (80 g, 437 mmole, 2.4 equiv.) was then added in small portions. The reaction was stirred at room temperature for 2 hours before it was stopped and the aqueous layer was extracted with ether. The combined ether layers were washed with water five times and dried over Na$_2$SO$_4$. The organic layer was filtered, evaporated to dryness and the residue was flash chromatographed on a silica-gel column to give the pure compound 23 (73 g), in a yield of 86%. The structure was confirmed by $^1$H NMR.

Example 7

Preparation of Blue Emitting Mw=7K Poly(9,9-dioctylfluorene) Oligomer with Reactive Boralane End Groups (24–26)

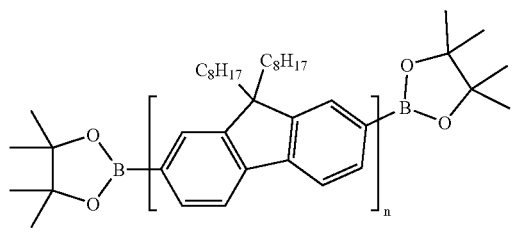

24–26

9,9-Dioctyl-2,7-bis(4,4,5,5-tetramethyl-1,3,2-dioxaborolan-2-yl)-fluorene (21)(9.63 g, 15 mmole, 1 equiv.) and 9,9-dioctyl-2,7-dibromo-fluorene (20) (5.75 g, 10.5 mmole, 0.7 equiv.) were mixed together with Aliquat® 336 (1.51 g, 3.75 mmole, 0.25 equiv.) in toluene (68 mL). 2 M $Na_2CO_3$ aqueous solution (23.4 mL) was added to the suspension and the suspension then degassed with nitrogen for half an hour. Tetrakis(triphenylphosphine) palladium(0) (73 mg, 0.063 mmole, 0.0042 equiv.) was then added to the mixture and the reaction then heated to reflux under nitrogen for 1 day. The reaction mixture was cooled down to room temperature and poured into a 500 mL methanol:water (9:1) mixture. The precipitate was purified by repeated dissolution in THF and precipitation in methanol. The product (24) was obtained as a light yellow powder (9.0 g, 100% yield). Gel permeation chromatography (GPC) analysis shows Mw 7,739 Daltons and Mn 3,880 Daltons and polydispersity (PD) of 1.99.

A similar procedure as in preparation of 24 was carried out (expect that 2 g ammonium acetate ($NH_4Ac$) was used in the 9:1 methanol/water mixture) to give compound 25 (7.4 g). Gel permeation chromatography analysis shows Mw 8,770 Daltons, Mn 4,590 Daltons and polydispersity of 1.91.

The same procedure as in the preparation of 25 was carried out with 9,9-dioctyl-2,7-bis(4,4,5,5-tetramethyl-1,3,2-dioxaborolan-2-yl)-fluorene (20) (30 g) and 9,9-dioctyl-2,7-dibromo-fluorene (21) (17.9 g), Aliquat® 336 (4.72 g), toluene (212 mL), 2 M $Na_2CO_3$ aqueous solution (73 mL) and tetrakis(triphenylphosphine) palladium(0) (0.226 g) to give compound 26 (27 g). Gel permeation chromatography analysis shows Mw 8,130 Daltons, Mn 4,440 Daltons and polydispersity of 1.83.

Example 8

Preparation of Green Emitting Mw=7K Poly(9,9-dioctylfluorene-co-benzthiadiazole) Oligomer with Reactive Boralane End Groups (27–29)

9,9-Dioctyl-2,7-bis(4,4,5,5-tetramethyl-1,3,2-dioxaborolan-2-yl)-fluorene 20 (9.63 g, 15 mmole, 1 equiv.) and 4,7-dibromo-2,1,3-benzothiadiazole 19 (3.087 g, 10.5 mmole, 0.7 equiv.) were mixed together with Aliquat® 336 (1.51 g, 3.75 mmole, 0.25 equiv.) in toluene (68 mL). 2 M $Na_2CO_3$ aqueous solution (23.4 mL) was added to the suspension and the suspension then degassed with nitrogen for half an hour. Tetrakis(triphenylphosphine) palladium (0) (73 mg, 0.063 mmole, 0.0042 equiv.) was then added to the mixture and the reaction then heated to reflux under nitrogen for 1 day. After the reaction mixture was cooled down to room temperature, it was poured into a 500 mL methanol:water (9:1) mixture. The precipitate was redissolved in 80 mL chloroform and poured into 300 mL methanol. The product (27) was obtained as a yellow powder (3.5 g, 64%). Gel permeation chromatography analysis shows Mw 7,290 Daltons, Mn 4,040 Daltons and polydispersity of 1.80.

A similar procedure as in preparation of 27 was carried out (expect that 2 g $NH_4Ac$ was used in the 9:1 methanol/water mixture) to give compound 28 (7.4 g). Gel permeation chromatography analysis shows Mw 6,040 Daltons, Mn 3,580 Daltons and polydispersity of 1.69.

The same procedure as in preparation of 28 was carried out with 9,9-dioctyl-2,7-bis(4,4,5,5-tetramethyl-1,3,2-dioxaborolan-2-yl)-fluorene 20 (35 g) and 4,7-dibromo-2,1,3-benzothiadiazole 19 (11.2 g), Aliquat® 336 (5.5 g), toluene (247 mL), 2 M $Na_2CO_3$ aqueous solution (85 mL) and tetrakis(triphenylphosphine) palladium(0) (0.264 g) to give compound 29 (26 g). Gel permeation chromatography analysis shows Mw 5,930 Daltons, Mn 3,250 Daltons and polydispersity of 1.82.

Example 9

Synthesis of Soft Segment End-Capped Poly(9,9-dioctylfluorene) Oligomer

In a glove box, a 500 mL round-bottomed flask fitted with a magnetic stir bar and rubber septa was charged with 3.90 g (0.025 mole) 2,2'-bipyridyl and 6.87 g(0.025 mole) bis(1,5-cyclooctadiene)nickel(0). The sealed flask was transferred to a fume hood and 75 mL dry toluene and 30 mL DMF added via cannula. The sealed flask was heated at 80° C. in an oil bath for 30 min. A solution of 0.50 g (0.0011 mole) 1,2-bis[β,β'-(p-bromophenoxy)ethoxy]ethane 18, 0.45 g (0.0028 mole) bromobenzene and 5.36 g (0.0098 mole) 2,7-dibromo-9,9-dioctylfluorene 21 in about 30 mL toluene was added via cannula. The sealed flask was heated for five minutes followed by the addition of 1.41 g (0.013 mole) 1,5-cyclooctadiene. Stirring was continued for 16 hours at 80° C.

The warm reaction mixture was stirred with 50 mL of concentrated HCl, diluted with an equal volume of water and then stirred for an additional 30 min. Attempted extraction

27–29

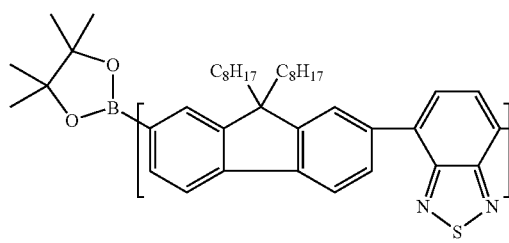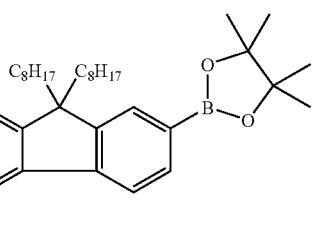

with THF gave a 3-phased system. The most upper phase was removed and was added to an excess of methanol to give a precipitate. This was collected by filtration and dried to give, by GPC, Mw 8,760 Daltons, Mn 4,420 Daltons, PD 1.98. The proton NMR gave signals at 3.82, 3.95 and 4.25 which when compared to a multiplet at 2.10 (CH$_2$ adjacent to fluorene C-9 position) suggested 8.85 mole % incorporation of 1,2-bis[β,β'-(p-bromophenoxy)ethoxy]ethane. Based on this stoichiometry we assume that the poly(9,9-dioctylfluorene) oligomer was terminated with the polyether capping group.

Example 10

Preparation of Soft Segment End Capped Blue Emitting Poly(9,9-dioctylfluorene) Oligomer (30)

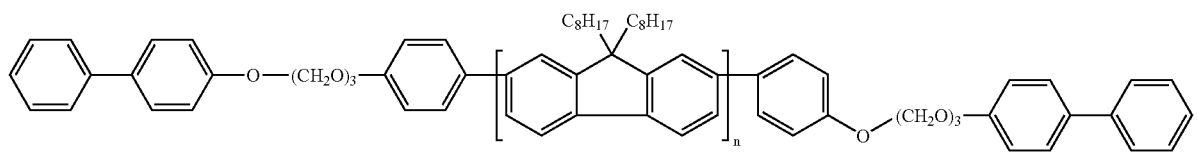

Into a 500 mL flask fitted with a reflux condenser, nitrogen bubbler and thermocouple were combined 1,2-bis[β,β'-(p-bromophenoxy)ethoxy]ethane (18) (0.874 g, 1.90 mmoles), 2.18 g blue oligomer 25 (0.475 mmoles), sodium carbonate (9.0 ml of 2M, 18 mmoles), Aliquat® 336 (0.20 g, 0.5 mmoles) and 34 mL of toluene. The content was degassed using a stream of nitrogen for 1 hour. The mixture was heated at reflux for 30 minutes followed by the addition of 0.01 g tetrakis(triphenylphosphine) palladium(0). Refluxing was continued for 2 days followed by cooling to room temperature. The content of the flask was slowly poured into a mixture of 500 mL methanol/50 mL water with vigorous stirring and the solid obtained then collected by filtration. The solid was dissolved in 75 ml of chloroform and slowly poured into 500 mL methanol with vigorous stirring and the precipitate collected by filtration and washed with 300 mL methanol and air dried.

Using the above apparatus and the same Suzuki coupling reagents, the dried polymer in 33 mL toluene was phenyl capped using 4,4,5,5-tetramethyl-2-phenyl-1,3,2-dioxaborolane (0.5 g). The cooled reaction mixture was slowly poured into a mixture of 400 mL methanol/50 mL water with vigorous stirring and the solid collected by filtration and dissolved in 50 ml of chloroform. The solution was passed through a small pad of silica gel on a course glass frit, the silica gel rinsed with 50 mL of chloroform and chloroform solutions combined, by pouring very slowly into 400 mL methanol with vigorous stirring. The solution was cloudy and contained no filterables. Concentration of the mixture by rotary evaporation precipitated a finely divided solid. This was collected and washed with 300 mL methanol and air drying gave 0.49 g of ether capped blue oligomer 30. Gel permeation chromatography analysis showed Mw 17,000 Daltons and Mn 7,230 Daltons and polydispersity of 2.4.

Example 11

Preparation of Soft Segment End Capped Green Emitting Poly(9,9-dioctylfluorene-co-benzthiadiazole) Oligomer (31)

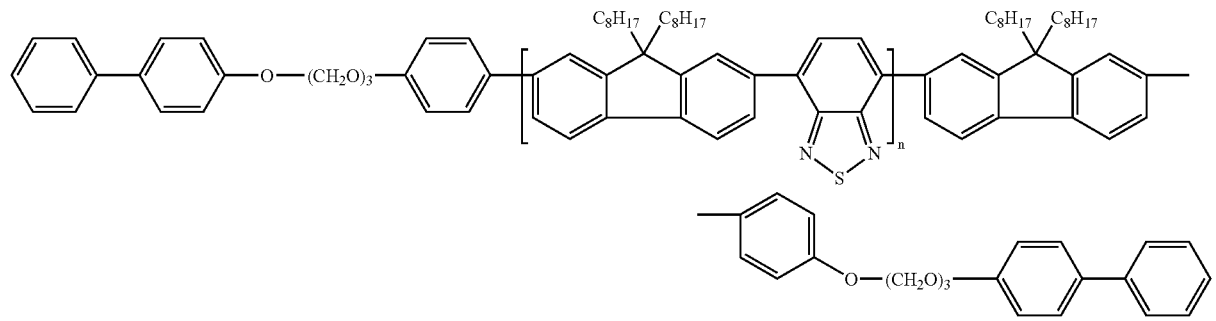

Into a 500 mL flask fitted with a reflux condenser, nitrogen bubbler and thermocouple were combined 1,2-bis[β,β'-(p-bromophenoxy)ethoxy]ethane (18) (2.0134 g, 4.37 mmoles), 3.5 g green oligomer 27 (0.875 mmoles), sodium carbonate (16.5 ml at 2M, 33 mmoles), Aliquat® 336 (0.35 g, 0.9 mmoles) and 54 ml of toluene. The content was degassed using a stream of nitrogen for 1 hour. The mixture was heated at reflux for 30 minutes followed by the addition of 0.01 g tetrakis(triphenylphosphine) palladium(0). Refluxing was continued for 2 days followed by cooling to room temperature. The content of the flask was slowly poured into a mixture of 400 mL methanol/50 mL water with vigorous stirring and the solid obtained then collected by filtration. The solid was dissolved in 20 mL of chloroform, passed through a small pad of silica gel and the silica gel then rinsed with 50 mL more chloroform. The combined chloroform solutions were slowly poured into 500 mL methanol with vigorous stirring and the precipitate collected by filtration and washed with 200 mL methanol and air dried.

Using the above apparatus and the same Suzuki coupling reagents, the dried polymer in 54 mL toluene was phenyl capped using 4,4,5,5-tetramethyl-2-phenyl-1,3,2-dioxaborolane (1.0 g). The cooled reaction mixture was slowly poured into a mixture of 400 mL methanol/50 mL water with vigorous stirring and the solid collected by filtration and dissolved in 50 mL of chloroform. The solution was passed through a small pad of silica gel on a course glass frit, the silica gel rinsed with 50 mL of chloroform and chloroform solutions combined. Pouring very slowly into 400 mL methanol with vigorous stirring, collecting the solid by filtration, washing this with 300 ml methanol and air drying gave 1.26 g of ether capped green oligomer 31.

Example 12

Preparation of Fluorenyl Terminated Poly(9,9-bis(3,6-dioxaheptyl)-fluorene) (32)

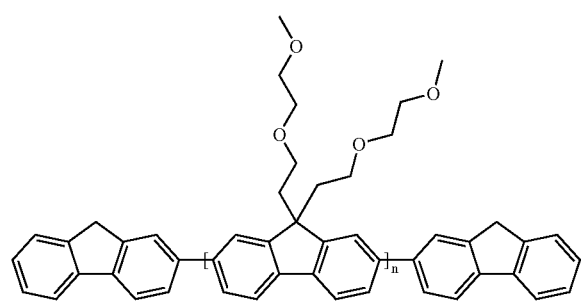

32

A Shlenk tube was charged with 2,7-dibromo-9,9-bis(3,6-dioxaheptyl)-fluorene 23 (2.64 g, 5.0 mmole), triphenyl phosphine (0.786 g, 3 mmole), zinc dust (1.07 g, 16.5 mmole), dipyridyl (0.156 g, 1 mmole), nickel bromide (0.218 g, 1 mmole), 2-bromo-fluorene (32 mg, 0.13 mmole), anhydrous toluene (15 mL) and anhydrous dimethyl formamide (DMF) (15 mL) under nitrogen. The reaction was heated at 80° C. for 4 days. After the reaction was cooled down, it was poured into methanol (60 mL). Concentrated HCl (5 mL) was then added and the mixture was stirred overnight to give a light yellow mass, which was collected by filtration. The mass was dissolved in tetrahydrofuran (THF) and precipitated from water to give 1.6 g of yellow powder in a yield of 87% polymer 32. Gel permeation chromatography analysis shows Mw 39,600 Daltons and Mn 8,480 Daltons and polydispersity of 4.67. DSC analysis gave Tg=82.6° C.

Example 13

Preparation of Phenyl Terminated Poly[(9,9-bis(3,6-dioxaheptyl)-fluorene)-co-(9,9-dioctylfluorene)] (33)

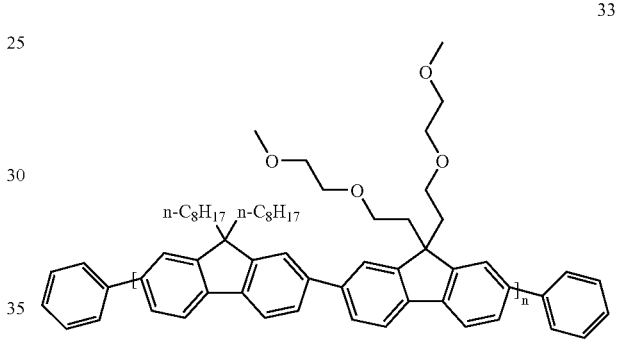

33

9,9-dioctyl-2,7-bis(4,4,5,5-tetramethyl-1,3,2-dioxaborolan-2-yl)-fluorene 20 (3.21 g, 5 mmole, 1 equiv.) and 2,7-dibromo-9,9-bis(3,6-dioxaheptyl)-fluorene 23 (2.38 g, 4.5 mmole, 0.9 equiv.) were mixed together with Aliquat® 336 (0.51 g, 1.25 mmole, 0.25 equiv.) in toluene (50 mL). 2 M $Na_2CO_3$ aqueous solution (8.6 mL) was added to the suspension and the suspension then degassed with nitrogen for half an hour. Tetrakis(triphenylphosphine) palladium(0) (24 mg, 0.021 mmole, 0.0042 equiv.) was then added to the mixture. The reaction was heated to reflux under nitrogen for three days. Phenyl bromide (0.5 g, 3.18 mmole) was added and the reaction then refluxed for another day. After the reaction mixture was cooled down to room temperature, it was poured into a 500 mL methanol: water (9:1) mixture. The precipitate was purified by repeated dissolution in THF and precipitation into methanol. The product (polymer 33) was obtained as a light yellow powder (3.04 g) in a yield of 89%. This polymer comprises 50% 9,9-bis(3,6-dioxaheptyl)-fluorene) units (BDOH) and 50% 9,9-dioctylfluorene units. Gel permeation chromatography analysis shows Mw 27,800 Daltons and Mn 8,370 Daltons and polydispersity of 3.33. DSC analysis gave Tg=64.6° C., Tc=100.7° C., Tm=145.1° C.

Example 14

Preparation of 25 Mole % BDOH Phenyl Terminated Poly[(9,9-bis(3,6-dioxaheptyl)-fluorene)-co-(9,9-dioctylfluorene)] (34)

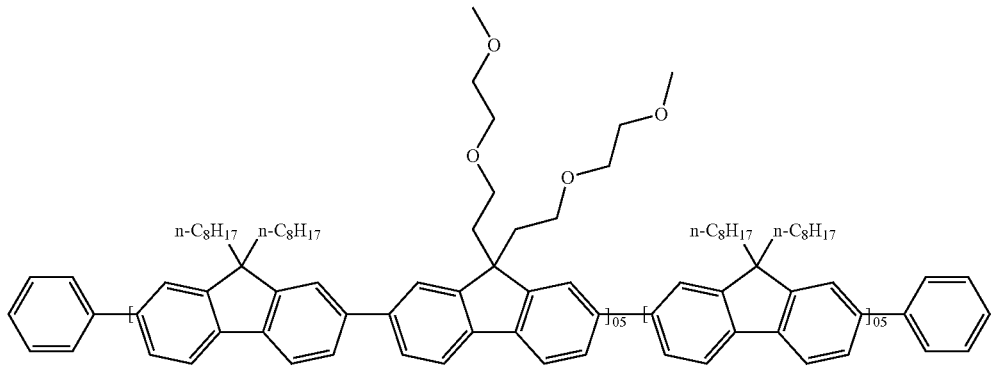

34

The procedure used in Example 13 was repeated using 2,7-dibromo-9,9-bis(3,6-dioxaheptyl)-fluorene 23 (1.19 g, 2.25 mmole, 0.45 equiv.), 9,9-dioctyl-2,7-bis(4,4,5,5-tetramethyl-1,3,2-dioxaborolan-2-yl)-fluorene 20 (3.21 g, 5 mmole, 5 equiv.), 9,9-dioctyl-2,7-dibromo-fluorene (1.21 g, 2.25 mmole, 0.45 equiv.), Aliquat® 336 (0.51 g, 1.25 mmole, 0.25 equiv.) and tetrakis(triphenylphosphine) palladium(0) (24 mg, 0.021 mmole, 0.0042 equiv.) in toluene (50 mL). The product (polymer 34) was obtained as a light green-yellow solid (3.1 g) in a yield of 91%. This polymer comprises 25% 9,9-bis(3,6-dioxaheptyl)-fluorene) units (BDOH) and 75% 9,9-dioctylfluorene units. Gel permeation chromatography analysis shows Mw 27,400 Daltons and Mn 8,110 Daltons and polydispersity of 3.38. DSC analysis gave Tg=57.5° C., Tc=103.6° C., Tm=136.6° C.

Example 15

Preparation of 10 Mole % BDOH Phenyl Terminated Poly[(9,9-bis(3,6-dioxaheptyl)-fluorene)-co-(9,9-dioctylfluorene)] (35)

The procedure used in Example 13 was repeated with 2,7-dibromo-9,9-bis(3,6-dioxaheptyl)-fluorene 23 (0.48 g, 0.9 mmole, 0.18 equiv.), 9,9-dioctyl-2,7-bis(4,4,5,5-tetramethyl-1,3,2-dioxaborolan-2-yl)-fluorene 20 (3.21 g, 5 mmole, 1 equiv.), 9,9-dioctyl-2,7-dibromo-fluorene 21 (1.97 g, 3.6 mmole, 0.72 equiv.), Aliquat® 336 (0.51 g, 1.25 mmole, 0.25 equiv.) and tetrakis(triphenylphosphine) palladium(0) (24 mg, 0.021 mmole, 0.0042 equiv.) in toluene 50 mL. The product (polymer 35) was obtained as a light green-yellow solid 2.9 g in a yield of 85%. This polymer comprises 10% 9,9-bis(3,6-dioxaheptyl)-fluorene) units (BDOH) and 90% 9,9-dioctylfluorene units. Gel permeation chromatography analysis shows Mw 29,300 Daltons and Mn 9,760 Daltons and polydispersity of 3.01. DSC analysis gave Tg=54.1° C., Tc=92.1° C., Tm=130.8° C.

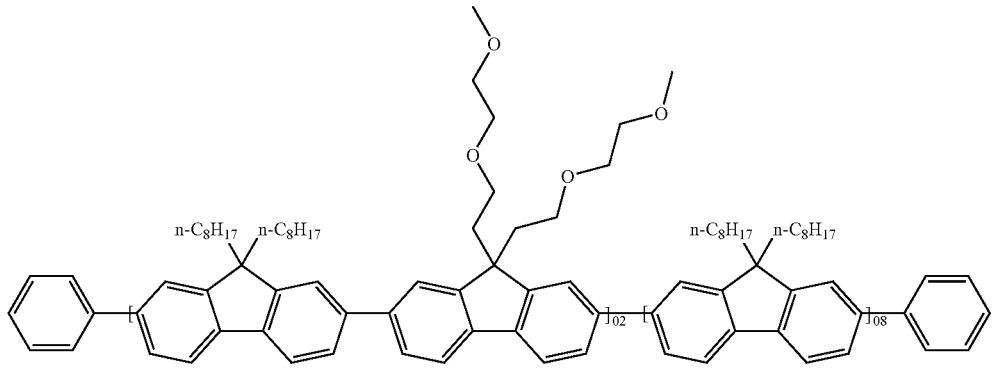

35

Example 16

Preparation of 25 Mole % BDOHP Phenyl Terminated Poly[(9,9-bis(3,6-dioxahexyl-6-phenyl)-fluorene)-co-(9,9-dioctylfluorene)] (36)

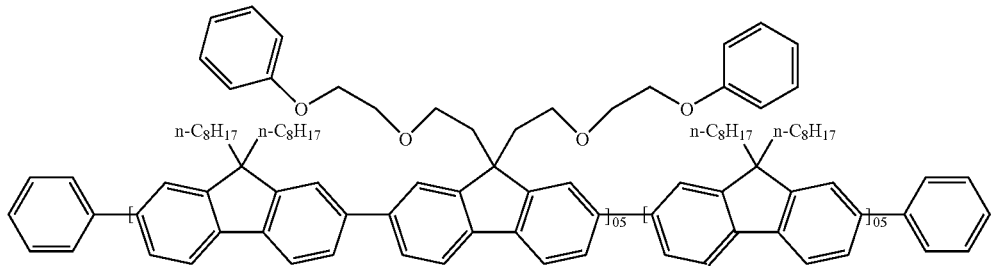

36

The procedure used in Example 13 was repeated with 2,7-dibromo-9,9-bis(3,6-dioxahexyl-6-phenyl)fluorene 22 (4.0 g, 6.13 mmole, 0.45 equiv.), 9,9-dioctyl-2,7-bis(4,4,5,5-tetramethyl-1,3,2-dioxaborolan-2-yl)fluorene 20 (8.75 g, 13.62 mmole, 1 equiv.), 9,9-dioctyl-2,7-dibromofluorene 21 (3.36 g, 6.13 mmole, 0.45 equiv.), Aliquat® 336 (0.51 g, 1.25 mmole, 0.25 equiv.) and tetrakis(triphenylphosphine) palladium (0) (79 mg, 0.068 mmole, 0.005 equiv.) in toluene (140 mL). The product (polymer 36) was obtained as a light green solid (11.5 g) in a yield of 90%. This polymer comprises 10% 9,9-bis(3,6-dioxahexyl-6-phenyl)fluorene) units (BDOHP) and 90% 9,9-dioctylfluorene units. Gel permeation chromatography analysis shows Mw 20,300 Daltons and Mn 7,770 Daltons and polydispersity of 2.61. 0.2 mg of the compound in 1 mL of toluene gave violet emission at λmax of 416 nm, and 435 nm(sh). DSC analysis gave Tg=50° C., Tc=91° C., Tm=155° C.

Example 17

Preparation of Green Emitting Block Copolymer (37, 38)

then rinsed with 50 mL more chloroform. The combined chloroform solutions were slowly poured into 750 mL methanol with vigorous stirring and the precipitate collected by filtration and washed with 200 mL methanol and air-dried.

Using the above apparatus and the same Suzuki coupling reagents, the dried polymer in 74 mL toluene was phenyl capped using 4,4,5,5-tetramethyl-2-phenyl-1,3,2-dioxaborolane (1.0 g) for two days. The organic layer was separated and slowly poured into a mixture of 500 mL methanol/50 mL water with vigorous stirring and the solid collected by filtration and dissolved in 75 mL of chloroform. The solution was passed through a small pad of silica gel on a course glass frit, the silica gel rinsed with 50 mL of chloroform and the chloroform solutions combined, by pouring very slowly into 750 mL methanol with vigorous stirring, collecting the solid by filtration, washing this with 200 ml methanol and air drying gave 3.2 g of ether capped green hard/soft segment polymer 37. Gel permeation chromatography analysis shows Mw 81,100 Daltons and Mn 26,000 Daltons and polydispersity of 3.12.

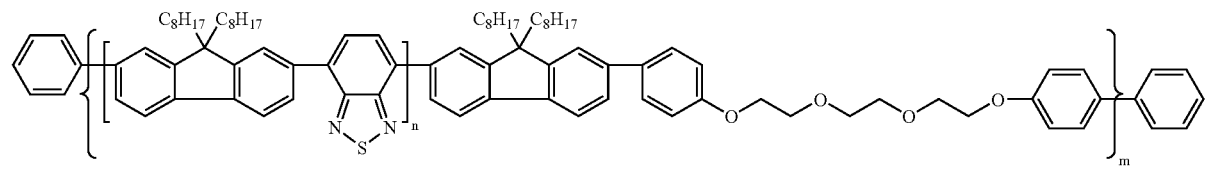

37, 38

Into a 500 mL flask fitted with a reflux condenser, nitrogen bubbler and thermocouple were combined 1,2-bis[β,β'-(p-bromophenoxy)ethoxy]ethane (18) (0.9912 g, 2.154 mmoles), 3.5 g green oligomer 29 (1.9800 mmoles), sodium carbonate (37 mL of 2M solution, 75 mmoles), Aliquat® 336 (0.80 g, 2.0 mmoles) and 74 ml of toluene. The content was degassed using a stream of nitrogen for 1 hour. The mixture was heated at reflux for 30 minutes followed by the addition of 0.02 g of tetrakis(triphenylphosphine) palladium (0). Refluxing was continued for 3 days followed by cooling to room temperature. The content of the flask was slowly poured into a mixture of 500 mL methanol/50 mL water with vigorous stirring and the solid obtained then collected by filtration. The solid was dissolved in 75 mL of chloroform, passed through a small pad of silica gel and the silica gel Preparation of green/soft segment polyfluorene 38: By adoption of the general method for the synthesis and isolation of the polymer 37, the reaction of 1,2-bis[β,β'-(p-bromophenoxy)ethoxy]ethane (18) (0.949 g, 2.0632 mmoles), green oligomer 29 (4.8824 g, 2.0084 mmoles), sodium carbonate (38 mL of 2M solution, 76 mmoles) and Aliquat® 336 (0.80 g, 2.0 mmoles) in 74 ml of toluene gave the corresponding bromine terminated green/soft segment polyfluorene 38. Capping with 1.0 g of 4,4,5,5-tetramethyl-2-phenyl-1,3,2-dioxaborolane in toluene under Suzuki coupling conditions as specified for polymer 37 gave 3.55 g of polymer 38. Gel permeation chromatography analysis shows Mw 104,000 Daltons and Mn 30,400 Daltons and polydispersity of 3.43.

Example 18

Preparation of Blue Emitting Block Copolymer (39, 40)

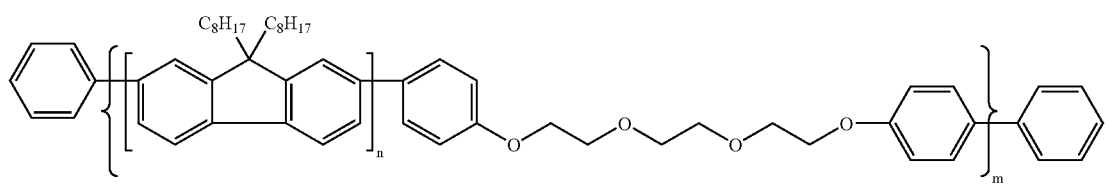

39, 40

By adoption of the general method for the synthesis and isolation of the polymer 37, the reaction of 1,2-bis[β,β'-(p-bromophenoxy)ethoxy]ethane (18) (0.8078 g, 1.7555 mmoles), blue oligomer 26 (4.8512 g, 1.5895 mmoles), sodium carbonate (30 mL of 2M solution, 60 mmoles) and Aliquat® 336 (0.60 g, 1.60 mmoles) in 75 ml of toluene gave the corresponding bromine terminated blue/soft segment polyfluorene 39. Capping with 1.0 g of 4,4,5,5-tetramethyl-2-phenyl-1,3,2-dioxaborolane in 75 mL toluene under Suzuki coupling conditions as specified for polymer 37, gave 2.8 g of polymer 39. Gel permeation chromatography analysis shows Mw 81,700 Daltons and Mn 32,100 Daltons and polydispersity of 2.55.

Preparation of blue/soft segment polyfluorene 40: By adoption of the general method for the synthesis and isolation of the polymer 37, the reaction of 1,2-bis[β,β'-(p-bromophenoxy)ethoxy]ethane (18) (0.7642 g, 1.66075 mmoles), blue oligomer 26 (4.9009 g, 1.6058 mmoles), sodium carbonate (30 mL of 2 M solution, 60 mmoles) and Aliquat® 336 (0.60 g, 1.60 mmoles) in 75 ml of toluene gave the corresponding bromine terminated blue/soft segment polyfluorene 40. Capping with 1.0 g of 4,4,5,5-tetramethyl-2-phenyl-1,3,2-dioxaborolane in 75 mL toluene under Suzuki coupling conditions as specified for polymer 37, gave 2.6 g of polymer 40. Gel permeation chromatography analysis shows Mw 102,000 Daltons and Mn 40,700 Daltons and polydispersity of 2.51.

Example 19

Preparation of a Donor Sheet Without a Transfer Layer

A thermal transfer donor sheet was prepared in the following manner. An LTHC solution, given in Table I, was coated onto a 0.1 mm thick polyethylene terephthalate (PET) film substrate (M7 from Teijin, Osaka, Japan). Coating was performed using a Yasui Seiki Lab Coater, Model CAG-150, using a microgravure roll with 150 helical cells per inch. The LTHC coating was in-line dried at 80° C. and cured under ultraviolet (UV) radiation.

TABLE I

LTHC Coating Solution

| Component | Trade Designation | Parts by Weight |
|---|---|---|
| carbon black pigment | Raven 760 Ultra[1] | 3.55 |
| polyvinyl butyral resin | Butvar B-98[2] | 0.63 |
| acrylic resin | Joncryl 67[3] | 1.90 |
| Dispersant | Disperbyk 161[4] | 0.32 |
| Surfactant | FC-430[5] | 0.01 |
| epoxy novolac acrylate | Ebecryl 629[6] | 12.09 |
| acrylic resin | Elvacite 2669[7] | 8.06 |
| 2-benzyl-2-(dimethylamino)-1-(4-(morpholinyl) phenyl) butanone | Irgacure 369[8] | 0.82 |
| 1-hydroxycyclohexyl phenyl ketone | Irgacure 184[8] | 0.12 |
| 2-butanone | | 45.31 |
| 1,2-propanediol monomethyl ether acetate | | 27.19 |

[1] Columbian Chemicals Co., Atlanta, GA
[2] Solutia Inc., St. Louis, MO
[3] S. C. Johnson & Son, Inc. Racine, WI
[4] Byk-Chemie USA, Wallingford, CT
[5] Minnesota Mining and Manufacturing Co., St. Paul, MN (synthesizable according to Example 5 of U.S. Pat. No. 3,787,351)
[6] UCB Radcure Inc., N. Augusta, SC
[7] ICI Acrylics Inc., Memphis, TN
[8] Ciba-Geigi Corp., Tarrytown, NY Next, an interlayer solution, given in Table II, was coated onto the cured LTHC layer by a rotogravure coating method using the Yasui Seiki lab coater, Model CAG-150, with a microgravure roll having 180 helical cells per lineal inch. This coating was in-line dried at 60° C. and cured under ultraviolet (UV) radiation.

TABLE II

Interlayer Coating Solution

| COMPONENT | PARTS BY WEIGHT |
|---|---|
| SR 351 HP (trimethylolpropane triacrylate ester, available from Sartomer, Exton, PA) | 14.85 |
| Butvar B-98 | 0.93 |
| Joncryl 67 | 2.78 |
| Irgacure 369 | 1.25 |
| Irgacure 184 | 0.19 |
| 2-butanone | 48.00 |
| 1-methoxy-2-propanol | 32.00 |

Example 20

Solution for Use on the Receptor

The following solution was prepared and coated on the receptor substrate: PEDT: PEDT (poly(3,4-ethylenedioxythiophene)) solution (CH-8000 from Bayer AG, Leverkusen, Germany, diluted 1:1 with deionized water) was filtered through a Whatman Puradisc™ 0.45 μm Polypropylene (PP) syringe filter.

Example 21

Preparation of the Receptor

Receptors consisting of unpatterned and patterned ITO on glass were used for LITI dosing evaluation and conventional lamp preparation, respectively. The patterned substrates were made using standard photolithographic methods. The receptors were processed as follows: ITO (indium tin oxide) glass (Delta Technologies, Stillwater, Minn., less than 100 Ω/square, 1.1 mm thick) was ultrasonically cleaned in a hot, 3% solution of Deconex 12NS (Borer Chemie AG, Zuchwil, Switzerland). The substrates were then placed in the Plasma Science plasma treater for surface treatment under the following conditions:

| Time: | 2 minutes |
|---|---|
| Power: | 500 watt (165 W/cm$^2$) |
| Oxygen Flow: | 100 sccm |

Immediately after plasma treatment, the PEDT solution as described in Example 20 was filtered and dispensed through a Whatman Puradisc™ 0.45 μm Polypropylene (PP) syringe filter onto the ITO substrate. The substrate was then spun (Headway Research spincoater) at 2000 rpm for 30 s yielding a PEDT film thickness of 40 nm. All of the substrates were heated to 200° C. for 5 minutes under nitrogen. In addition, some of the PEDT coated substrates were plasma treated. In this case, the substrate was placed into the Plasma Sciences Plasma Tester under the following conditions.

| Time: | 20 s |
|---|---|
| Power: | 500 W (165 W/cm$^2$) |
| Argon Flow: | 20 sccm |
| Pressure: | 125 mTorr |

Example 22

Preparation of Solutions for Thermal Transfer Experiments

The following procedure was used to prepare solutions for thermal transfer experiments: The polymeric materials from Examples 9, 10, 13, 14, 15, 17, and 18 respectively were independently dissolved at 2 wt/wt % into toluene (HPLC grade obtained from Aldrich Chemical, Milwaukee, Wis.) by stirring for 1–2 hours at room temperature. Each solution was filtered through a 0.45 μm polypropylene (PP) syringe filter before application.

Example 23

Preparation of Transfer Layers on Donor Sheet and Laser Induced Thermal Imaging of Transfer Layers Transfer layers were formed on the donor sheets of Example 19. The transfer layers were disposed on the donor sheets by spinning (Headway Research spincoater) at about 2000–2500 rpm for 30 s to yield a film thickness of approximately 100 nm.

Donor sheets coated solutions as described above were brought into contact with receptor substrates as prepared in Example 21. Next, the donors were imaged using two single-mode Nd:YAG lasers. Scanning was performed using a system of linear galvanometers, with the combined laser beams focused onto the image plane using an f-theta scan lens as part of a near-telecentric configuration. The laser energy density was 0.4 to 0.8 J/cm$^2$. The laser spot size, measured at the 1/e$^2$ intensity, was 30 micrometers by 350 micrometers. The linear laser spot velocity was adjustable between 10 and 30 meters per second, measured at the image plane. The laser spot was dithered perpendicular to the major displacement direction with about a 100 micrometer amplitude. The transfer layers were transferred as lines onto the receptor substrates, and the intended width of the lines was about 100 micrometers.

This example demonstrated that incorporation of polar poly(oxyalkylene) soft segments as capping groups, side chains, or internal soft segments in polyfluorene light emitting polymers can enhance thermal transfer of polyfluorenes to conducting ionic buffer layers such as PEDT. Polyether segments were chosen because they are electro-inactive and because they are solubility matched with PEDT buffer layers.

The polymers of Examples 9, 10, 13, 14, and 15 all transferred without defect and with smooth edges to PEDT substrates and the polymers of Examples 17 and 18 transfer with well defined lines that have breaks. Corresponding control samples involving poly(9,9-dioctyl-fluorene) homopolymers did not transfer as well to these substrates under similar conditions. It is thought, without wishing to be bound by any particular theory, that this result may be explained by a solubility parameter mismatch between poly (9,9-dioctyl-fluorene) ($\delta=16$ J$^{1/2}$ cm$^{-3/2}$) and PEDT ($\delta=23$ J$^{1/2}$ cm$^{-3/2}$). This mismatch is overcome by the addition of polar poly(oxyalkylene) soft segments in the new polymers of this invention. Hydrophilic polyether homopolymers are known to exhibit solubility parameters in the range of $\delta=22$ J$^{1/2}$ cm$^{-3/2}$ that will match well to PEDT.

Example 24

Preparation of OLED Devices

Electroluminescent devices were prepared as follows. The polymeric materials of Examples 9, 10, 11, 13, 14, 15, 16, 17, and 18 were independently dissolved at 1–3 wt/wt % into toluene (HPLC grade obtained from Aldrich Chemical, Milwaukee, Wis.) by stirring for 1–2 hours at room temperature. In some cases, a hole transporting agent (HTA) such as TPD (N,N'-bis(3-methylphenyl)-N,N'-bis(phenyl) benzidine), NPB (N,N'-diphenyl-N,N'-bis(1-naphthylphenyl)-1,1'-biphenyl-4,4'-diamine), or CBP (N,N'-dicarbazolebiphenyl) were added in a ratio of polymer/HTA=10:3. Each solution was filtered through a 0.45 μm polypropylene (PP) syringe filter before application. These solutions were spin coated onto PEDT coated ITO substrates. Cathodes were applied by vapor depositing either 1 nm LiF/200 nm Al (polymers of Examples 9, 10, 11, 13, 14, 15, and 16) or 40 nm calcium/400 nm silver (polymers of Examples 17 and 18). In all cases, light was seen from the conventional lamps. The devices showed diode type behavior. The observed color is violet (Examples 9 and 10), white (Example 13), blue-white (Example 14), blue (Examples 16 and 18), light blue (Example 15), and green (Examples 11 and 17).

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

Each of the patents, patent documents, and publications cited above is hereby incorporated into this document as if reproduced in full.

What is claimed is:

1. A composition comprising a light emitting polymer comprising a plurality of arylene monomeric units and a plurality of soft segment units comprising a plurality of soft segment end caps, wherein the soft segment end caps comprise poly(oxyalkylene) or poly(dialkylsiloxane) functionalities.

2. A composition comprising a light emitting polymer comprising a plurality of arylene monomeric units and a plurality of soft segment units comprising soft segment side chains coupled to a portion, but not all, of the arylene monomeric units, wherein the soft segment side chains comprise poly(oxyalkylene) or poly(dialkylsiloxane) functionalities.

3. A composition comprising a light emitting polymer comprising a plurality of arylene monomeric units and a plurality of soft segment units, wherein the plurality of soft segment units comprise a plurality of internal soft segment monomeric units, wherein the internal soft segment monomeric units comprise a functional group selected from oxyalkylene, poly(oxyalkylene), and poly(dialkylsiloxane) groups.

4. A composition comprising a light emitting polymer comprising a plurality of arylene monomeric units and a plurality of soft segment units independently selected from soft segment end caps; soft segment side chains coupled to a portion, but not all, of the arylene monomeric units; internal soft segment monomeric units; and combinations thereof, wherein the composition comprises a polymer selected from one of Formulas I to XVII:

$$EC \!-\!\!\left[D_1\right]_{\!n}\!\!-\!EC \quad \text{I}$$

$$EC \!-\!\!\left[D_1\right]_{\!n}\!\!-\!\!\left[Ar_1\right]_{\!m}\!\!-\!EC \quad \text{II}$$

$$EC \!-\!\!\left[Ar_1\!-\!D_1\right]_{\!n}\!\!-\!\!\left[D_2\right]_{\!m}\!\!-\!EC \quad \text{III}$$

$$EC \!-\!\!\left[Ar_1\!-\!D_1\right]_{\!n}\!\!-\!\!\left[Ar_2\!-\!D_2\right]_{\!m}\!\!-\!EC \quad \text{IV}$$

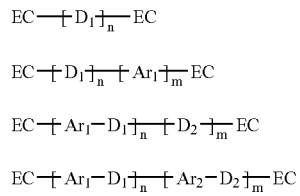

V

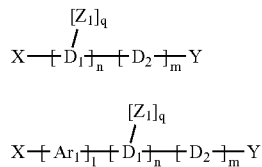

VI

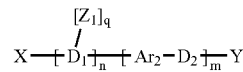

VII

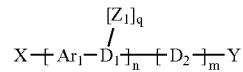

VIII

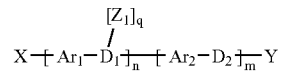

IX $$X \!-\!\!\left[\!\left[D_1\right]_{\!n}\!\!-\!T\right]_{\!m}\!\!-\!Y \quad \text{X}$$

$$X \!-\!\!\left[D_1\!-\!\!-\!T\right]_{\!m}\!\!-\!Y \quad \text{XI}$$

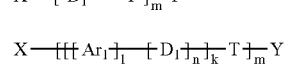

XII

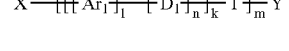

XIII

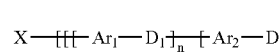

XIV

XV

XVI

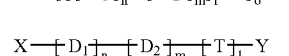

XVII wherein $D_1$ and $D_2$ are substituted or unsubstituted arylene moieties, each EC is independently a soft segment end cap group, X and Y are capping groups, $Ar_1$ and $Ar_2$ are independently selected from substituted and unsubstituted C6–C20 arylene, substituted and unsubstituted C2–C20 heteroarylene, and substituted and unsubstituted C18–C60 divalent triarylamines, k, l, m, n, and o are integers in the range of 2 to 1000, q is an integer in the range of 1 to 4, each $Z_1$ is independently a soft segment side chain, and each T is independently a soft segment moiety.

5. The composition of claim 4, wherein the light emitting polymer is selected from the Formulas I to IV and each EC comprises an end cap group having the general formula

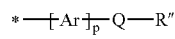

where Ar is substituted or unsubstituted arylene or substituted or unsubstituted heteroarylene, p is 0 or 1, R″ is a sterically hindering functional group, and Q is a soft segment moiety.

6. The composition of claim 4, wherein the light emitting polymer is selected from the Formulas V to IX and each $Z_1$ is independently a soft segment side chain having the general formula

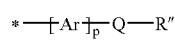

where Ar is substituted or unsubstituted arylene or substituted or unsubstituted heteroarylene, p is 0 or 1, R″ is substituted or unsubstituted alkyl, substituted or unsubstituted aryl, or substituted or unsubstituted heteroaryl, and Q is a soft segment moiety.

7. The composition of claim 4, wherein the light emitting polymer is selected from the Formulas X to XVII and each T includes independently two or more functional groups selected from ethers, fluoroalkylenes, perfluoroalkylenes, secondary or tertiary amines, thioethers, esters, dialkylsiloxanes, and dialkoxysiloxanes.

8. The composition of claim 7, wherein each Q comprises a poly(oxyalkylene) or poly(dimethylsiloxane).

9. The composition of claim 4, wherein the light emitting polymer is selected from Formulas II to X and XII to XVII and the light emitting polymer is a random copolymer.

10. The composition of claim 4, wherein the light emitting polymer is selected from Formulas II, III, IV, V, VII, VIII, IX, XV, and XVII and the light emitting polymer is an alternating copolymer.

11. A composition comprising a light emitting polymer comprising a plurality of arylene monomeric units and a plurality of soft segment units independently selected from soft segment end caps; soft segment side chains coupled to a portion, but not all, of the arylene monomeric units; internal soft segment monomeric units; and combinations thereof, wherein the light emitting polymer is selected from Formulas I' to XVII':

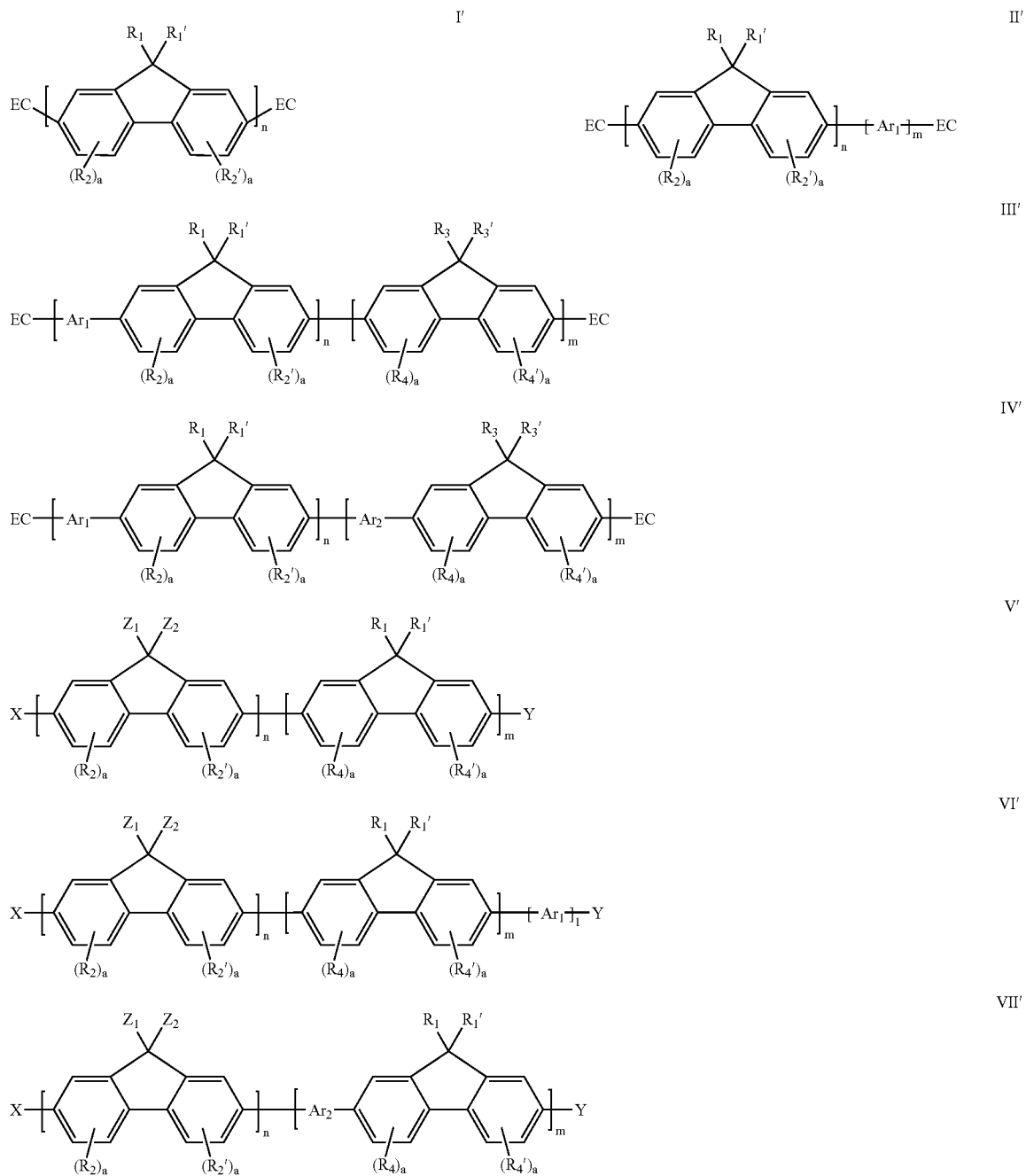

-continued
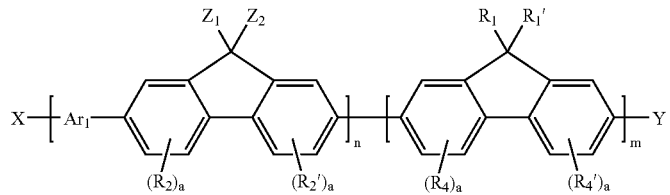 VIII'
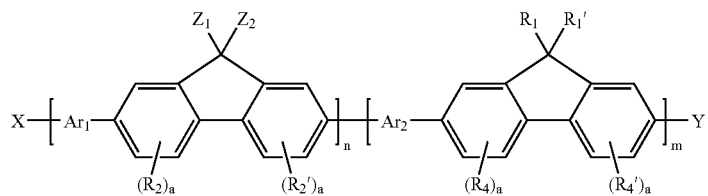 IX'
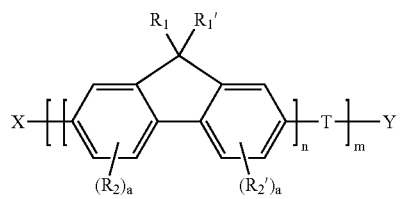 X'
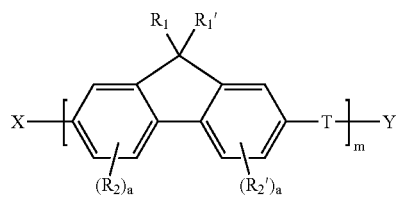 XI'
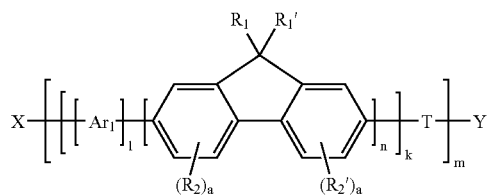 XII'
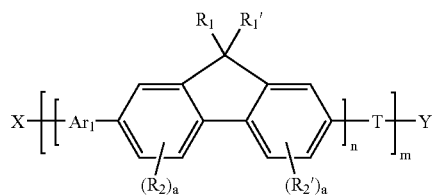 XIII'
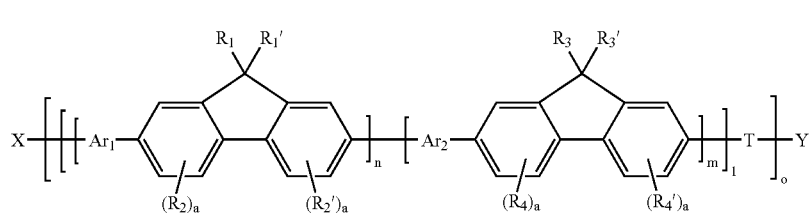 XIV'
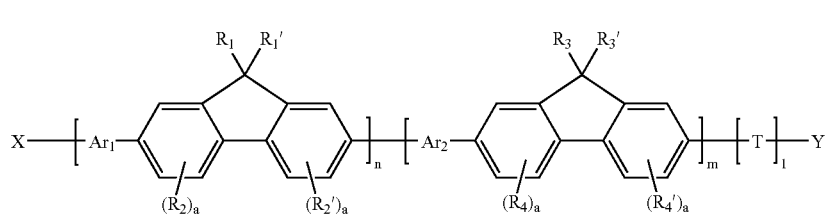 XV'
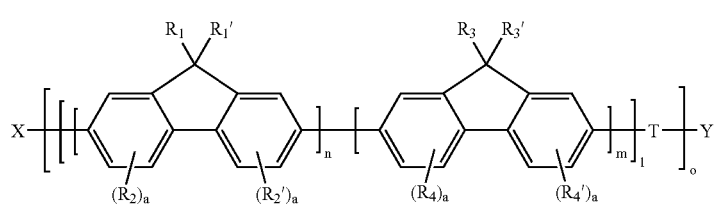 XVI'

-continued

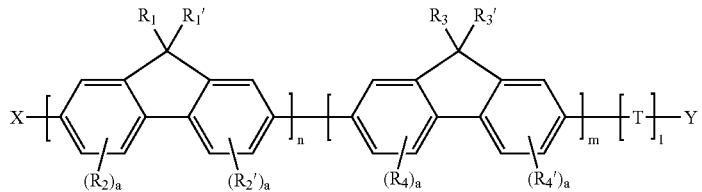

XVII' wherein
- $R_1$, $R_1'$, $R_3$, and $R_3'$ are independently hydrogen, substituted or unsubstituted C1–C30 alkyl, substituted or unsubstituted C6–C20 aryl, substituted or unsubstituted C3–C20 heteroaryl, or substituted or unsubstituted C1–C30 hydrocarbyl containing one or more S, N, O, P, or Si atoms;
- $R_2$, $R_2'$, $R_4$ and $R_4'$ are independently substituted or unsubstituted C1–C20 alkyl, substituted or unsubstituted C6–C20 aryl, substituted or unsubstituted C3–C20 heteroaryl, or substituted or unsubstituted C1–C30 hydrocarbyl containing one or more S, N, O, P, or Si atoms;
- a is independently in each occurrence 0 or 1;
- each EC is independently a soft segment end cap group;
- X and Y are capping groups;
- $Ar_1$ and $Ar_2$ are independently selected from substituted and unsubstituted C6–C20 arylene, substituted and unsubstituted C2–C20 heteroarylene, and substituted and unsubstituted C18–C60 divalent triarylamines;
- k, l, m, n, and o are integers in the range of 2 to 1000;
- each $Z_1$ and $Z_2$ is independently a soft segment side chain; and
- each T is independently a soft segment moiety.

12. A composition comprising a light emitting polymer comprising a plurality of arylene monomeric units and a plurality of soft segment units independently selected from soft segment end caps; soft segment side chains coupled to a portion, but not all, of the arylene monomeric units; internal soft segment monomeric units; and combinations thereof, wherein the composition comprises a light emitting polymer selected from Formulas I" to XIII":

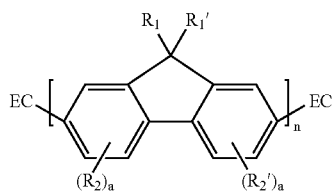

I"

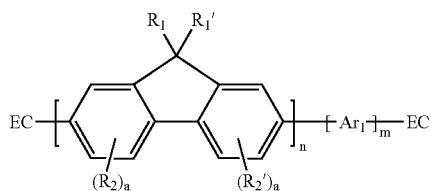

II"

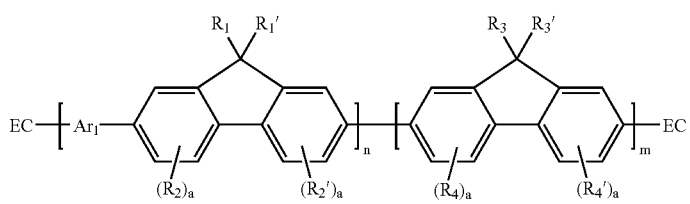

III"

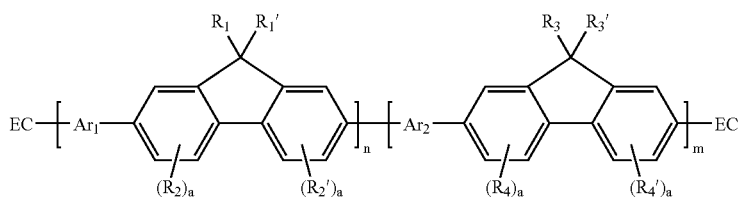

IV"

-continued
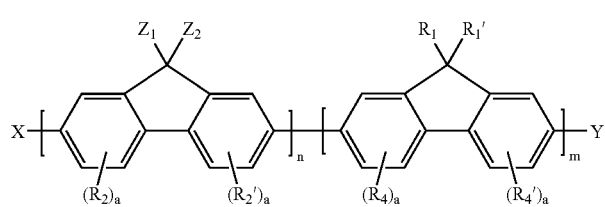
V″
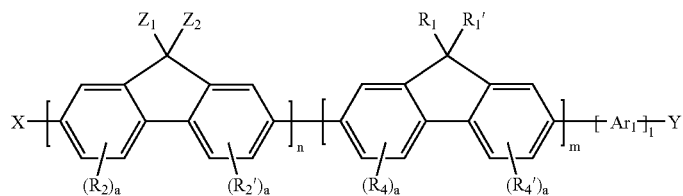
VI″
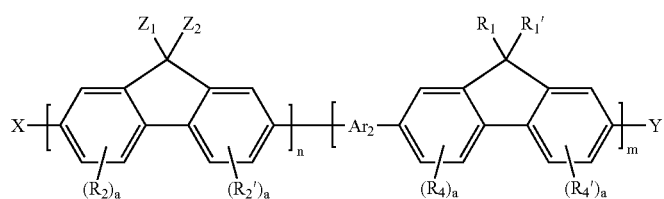
VII″
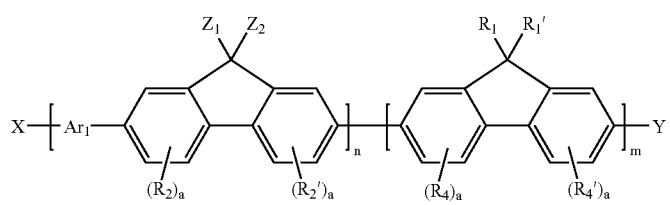
VIII″
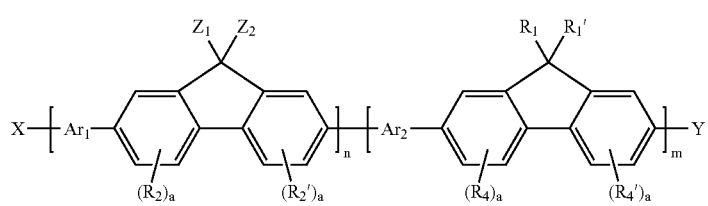
IX″
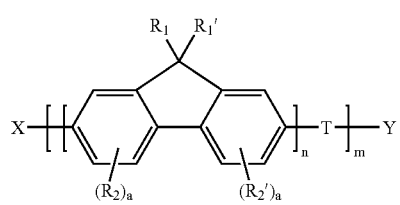
X″
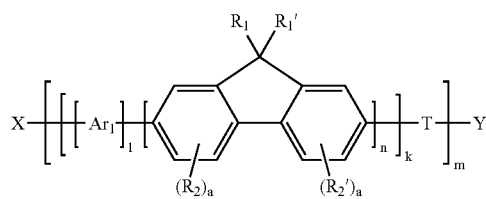
XI″
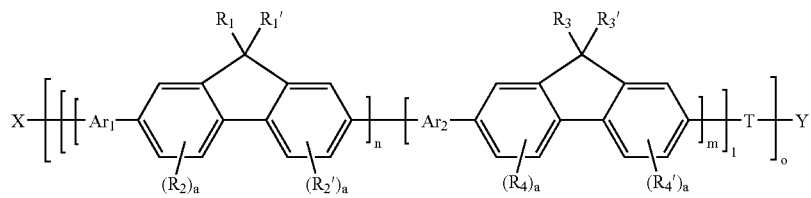
XII″

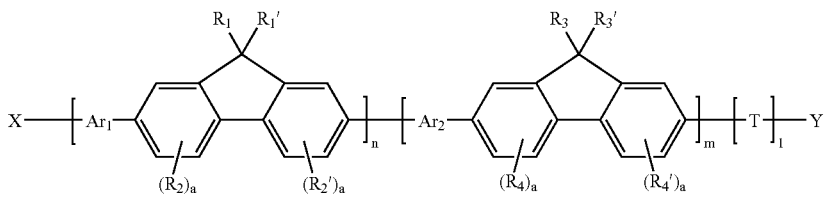

wherein
- R₁, R₁', R₃, and R₃' are independently hydrogen, substituted or unsubstituted C1–C30 alkyl, substituted or unsubstituted C6–C20 aryl, substituted or unsubstituted C3–C20 heteroaryl, or substituted or unsubstituted C1–C30 hydrocarbyl containing one or more S, N, O, P, or Si atoms;
- R₂, R₂', R₄ and R₄' are independently substituted or unsubstituted C1–C20 alkyl, substituted or unsubstituted C6–C20 aryl, substituted or unsubstituted C3–C20 heteroaryl, or substituted or unsubstituted C1–C30 hydrocarbyl containing one or more S, N, O, P, or Si atoms;
- a is independently in each occurrence 0 or 1;
- each EC is independently a soft segment end cap group having the formula:

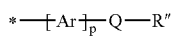

wherein Ar is substituted or unsubstituted arylene or substituted or unsubstituted heteroarylene, p is 0 or 1, R" is a sterically hindering functional group selected from aryl, heteroaryl, and branched alkyl, and Q is a soft segment moiety having two or more functional groups selected from ethers, secondary or tertiary amines, thioethers, dialkylsiloxanes, and dialkoxysiloxanes;
- X and Y are capping groups;
- Ar₁ and Ar₂ are independently selected from substituted and unsubstituted C6–C20 arylene and substituted and unsubstituted C2–C20 heteroarylene;
- k, l, m, n, and o are integers in the range of 2 to 1000;
- each Z₁ and Z₂ is independently a soft segment side chain having the formula:

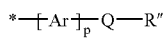

wherein Ar is substituted or unsubstituted arylene or substituted or unsubstituted heteroarylene, p is 0 or 1, R" is a sterically hindering functional group selected from aryl, heteroaryl, and alkyl, and Q is a soft segment moiety having two or more functional groups selected from ethers, secondary or tertiary amines, thioethers, dialkylsiloxanes, and dialkoxysiloxanes; and
- each T is independently a soft segment moiety having two or more functional groups selected from ethers, secondary or tertiary amines, thioethers, dialkylsiloxanes, and dialkoxysiloxanes.

13. An electroluminescent device comprising a light emitting polymer comprising a plurality of arylene monomeric units and a plurality of soft segment units independently selected from soft segment end caps; soft segment side chains coupled to a portion, but not all, of the arylene monomeric units; internal soft segment monomeric units; and combinations thereof, wherein the light emitting polymer comprises a polymer selected from one of Formulas I to XVII:

   I

   II

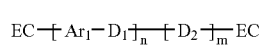   III

   IV

   V

   VI

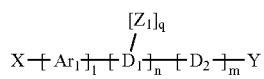   VII

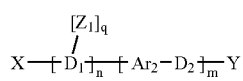   VIII

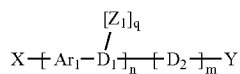   IX

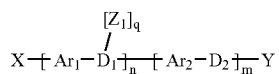   X

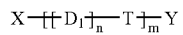   XI

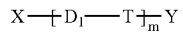   XII

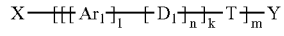   XIII

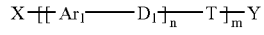   XIV

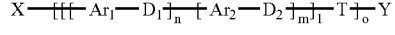   XV

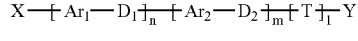   XVI

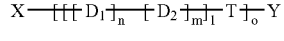   XVII wherein D₁ and D₂ are substituted or unsubstituted arylene moieties, each EC is independently a soft segment end cap group, X and Y are capping groups, Ar₁ and Ar₂ are independently selected from substituted and unsubstituted C6–C20 arylene, substituted and unsubstituted C2–C20 heteroarylene, and substituted and unsubstituted C18–C60 divalent triarylamines, k, l, m, n, and o are integers in the range of 2 to 1000, q is an integer in the range of 1 to 4, each $Z_1$ is independently a soft segment side chain, and each T is independently a soft segment moiety.

* * * * *

UNITED STATES PATENT AND TRADEMARK OFFICE
CERTIFICATE OF CORRECTION

PATENT NO. : 7,241,512 B2
APPLICATION NO. : 10/285114
DATED : July 10, 2007
INVENTOR(S) : Yingbo Li It is certified that error appears in the above-identified patent and that said Letters Patent is hereby corrected as shown below:

Page 2, Col. 1, (Foreign Patent Documents),
Line 8, Delete "1003351" and insert -- 1003354 --, therefor.

Page 3, Col. 2, (Other Publications),
Line 2, Delete "1-15" and insert -- 1-25 --, therefor.

Column 11,
Line 5, Delete "Theological" and insert -- rheological --, therefor.

Column 22,
Line 56, Delete "polyamide" and insert -- polyaramide --, therefor.

Column 29,
Line 35, Delete "binder" and insert -- binder. --, therefor.

Column 36,
Line 36, Delete "9.9" and insert -- 9,9 --, therefor.

Column 41,
Line 5, (approx.), Delete "9.9" and insert -- 9,9 --, therefor.
Line 31, (approx.), After "fluorine" insert -- 21 --.
Line 46, (approx), Delete "9.9" and insert -- 9,9 --, therefor.

Column 59,
Line 45, In Claim 12, delete "of2" and insert -- of 2 --, therefor. (Consider Space)

Signed and Sealed this

Twenty-fifth Day of December, 2007

JON W. DUDAS
*Director of the United States Patent and Trademark Office*